(12) United States Patent
Yamakawa et al.

(10) Patent No.: US 12,400,889 B2
(45) Date of Patent: Aug. 26, 2025

(54) DEFECT INSPECTION DEVICE

(71) Applicant: HITACHI HIGH-TECH CORPORATION, Tokyo (JP)

(72) Inventors: Hiromichi Yamakawa, Tokyo (JP); Toshifumi Honda, Tokyo (JP); Yuta Urano, Tokyo (JP); Shunichi Matsumoto, Tokyo (JP); Masaya Yamamoto, Tokyo (JP); Eiji Arima, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 211 days.

(21) Appl. No.: 18/272,859

(22) PCT Filed: Jan. 29, 2021

(86) PCT No.: PCT/JP2021/003285
§ 371 (c)(1),
(2) Date: Jul. 18, 2023

(87) PCT Pub. No.: WO2022/162881
PCT Pub. Date: Aug. 4, 2022

(65) Prior Publication Data
US 2024/0096667 A1    Mar. 21, 2024

(51) Int. Cl.
*H01L 21/67* (2006.01)
*G01N 21/95* (2006.01)
(Continued)

(52) U.S. Cl.
CPC ... *H01L 21/67288* (2013.01); *G01N 21/9501* (2013.01); *G06T 7/60* (2013.01);
(Continued)

(58) Field of Classification Search
CPC ....... H01L 21/67288; G06T 7/70; G06T 7/60; G06T 2207/30148; G01N 21/9501;
(Continued)

(56) References Cited

U.S. PATENT DOCUMENTS 7,525,649 B1    4/2009  Leong et al.
8,922,764 B2   12/2014  Urano et al.
(Continued)

FOREIGN PATENT DOCUMENTS

JP    H08-201306 A    8/1996
JP    2007-033433 A   2/2007
(Continued)

OTHER PUBLICATIONS

Search Report mailed Apr. 27, 2021 in International Application No. PCT/JP2021/003285.
(Continued)

*Primary Examiner* — Jamil Ahmed
(74) *Attorney, Agent, or Firm* — Miles & Stockbridge, P.C.

(57) ABSTRACT

A defect inspection device in which an optical axis of a detection optical system is inclined with respect to a surface of a sample, and an imaging sensor is inclined with respect to the optical axis, a height variation amount of an illumination spot in a normal direction of the surface of the sample is calculated based on an output of a height measuring unit, a deviation amount of the focusing position with respect to the light receiving surface in an optical axis direction of the detection optical system is calculated based on the height variation amount of the illumination spot, the deviation amount of the focusing position being generated accompanying a height variation of the illumination spot, and the focus actuator is controlled based on the deviation amount of
(Continued)

the focusing position, and scattered light intensities at the same coordinates of the sample are added.

11 Claims, 10 Drawing Sheets

(51) Int. Cl.
    *G06T 7/60* (2017.01)
    *G06T 7/70* (2017.01)
    *H04N 23/67* (2023.01)

(52) U.S. Cl.
    CPC .......... *G06T 7/70* (2017.01); *G01N 2201/103* (2013.01); *G01N 2201/1087* (2013.01); *G01N 2201/121* (2013.01); *G06T 2207/30148* (2013.01); *H04N 23/67* (2023.01)

(58) Field of Classification Search
    CPC ..... G01N 2201/103; G01N 2201/1087; G01N 2201/121; H04N 23/67
    See application file for complete search history.

(56) References Cited

U.S. PATENT DOCUMENTS

| | | |
|---|---|---|
| 2005/0052644 A1 | 3/2005 | Lewis et al. |
| 2006/0290923 A1 | 12/2006 | Nakano et al. |
| 2009/0059216 A1 | 3/2009 | Shibata et al. |
| 2009/0185179 A1 | 7/2009 | Hill |
| 2009/0279081 A1 | 11/2009 | Urano et al. |
| 2012/0092656 A1 | 4/2012 | Nakao et al. |
| 2013/0003052 A1 | 1/2013 | Nakao et al. |
| 2013/0176552 A1 | 7/2013 | Brown et al. |
| 2013/0301042 A1* | 11/2013 | Urano .................. G01N 21/956 356/237.5 |
| 2014/0270471 A1 | 9/2014 | Cao et al. |
| 2015/0146200 A1 | 5/2015 | Honda et al. |
| 2020/0256804 A1 | 8/2020 | Honda et al. |
| 2022/0291140 A1 | 9/2022 | Honda et al. |
| 2022/0357285 A1 | 11/2022 | Honda et al. |

FOREIGN PATENT DOCUMENTS

| | | |
|---|---|---|
| JP | 2009-053132 A | 3/2009 |
| JP | 2009-236791 A | 10/2009 |
| JP | 2011-013058 A | 1/2011 |
| JP | 2011-158260 A | 8/2011 |
| JP | 2012-021994 A | 2/2012 |
| JP | 2012-137350 A | 7/2012 |
| JP | 2014-534611 A | 12/2014 |
| JP | 2015-028457 A | 2/2015 |
| WO | 2007110672 A1 | 10/2007 |
| WO | 2013161912 A1 | 10/2013 |
| WO | 2018216277 A1 | 11/2018 |
| WO | 2020136697 A1 | 7/2020 |
| WO | 2021024319 A1 | 2/2021 |
| WO | 2021029025 A1 | 2/2021 |

OTHER PUBLICATIONS

Written Opinion mailed Apr. 27, 2021 in International Application No. PCT/JP2021/003285.
Search Report mailed Oct. 15, 2019 in International Application No. PCT/JP2019/031918.
Written Opinion mailed Oct. 15, 2019 in International Application No. PCT/JP2019/031918.
Search Report mailed Nov. 5, 2019 in International Application No. PCT/JP2019/030561.
Written Opinion mailed Nov. 5, 2019 in International Application No. PCT/JP2019/030561.
International Preliminary Report on Patentability mailed Jun. 7, 2021 in International Application No. PCT/JP2019/030561.
International Preliminary Report on Patentability mailed Nov. 11, 2021 in International Application No. PCT/JP2021/003285.
International Preliminary Report Patentability mailed Aug. 3, 2023 in International Application No. PCT/JP2021/003285.

* cited by examiner

[FIG. 1]
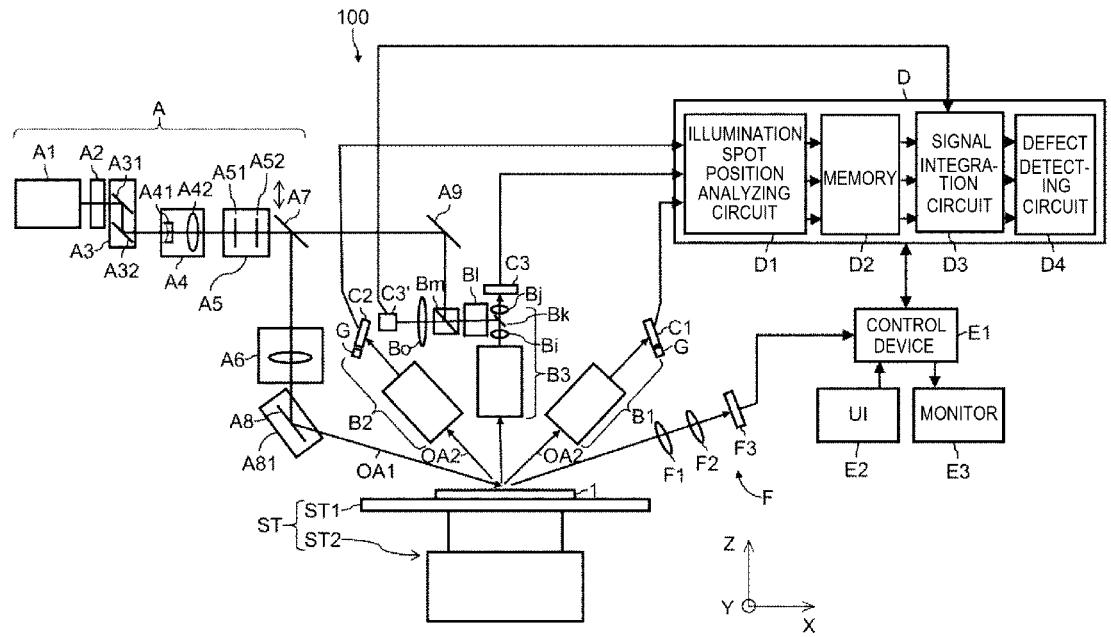
[FIG. 2]
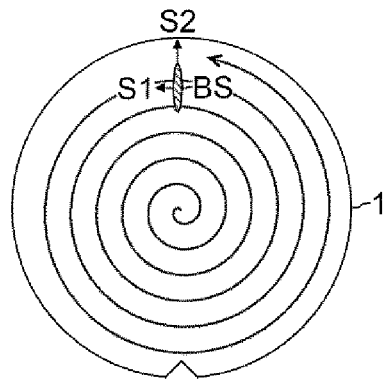
[FIG. 3]
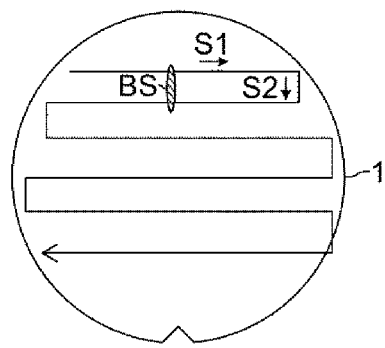

[FIG. 4]
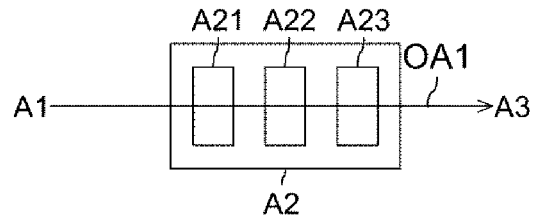
[FIG. 5]
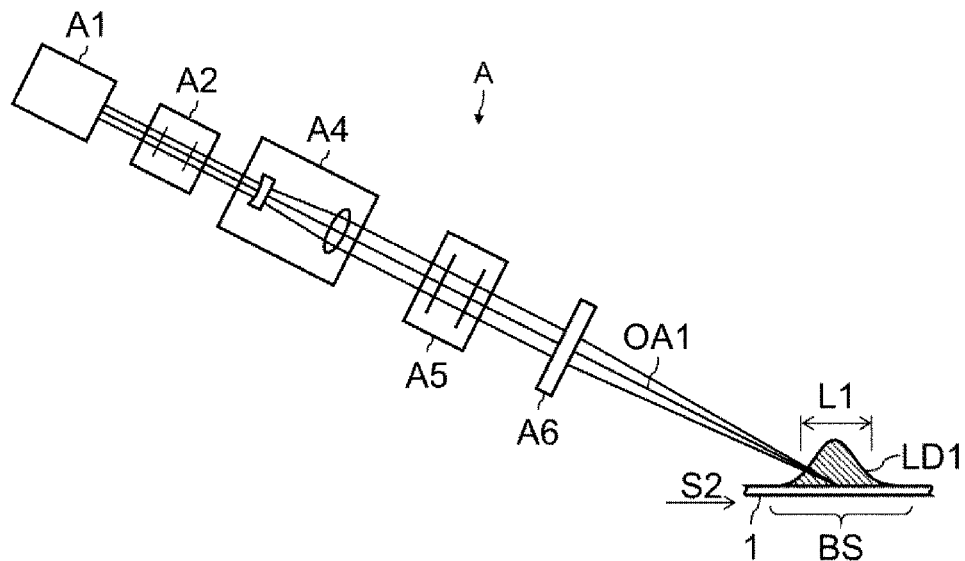
[FIG. 6]
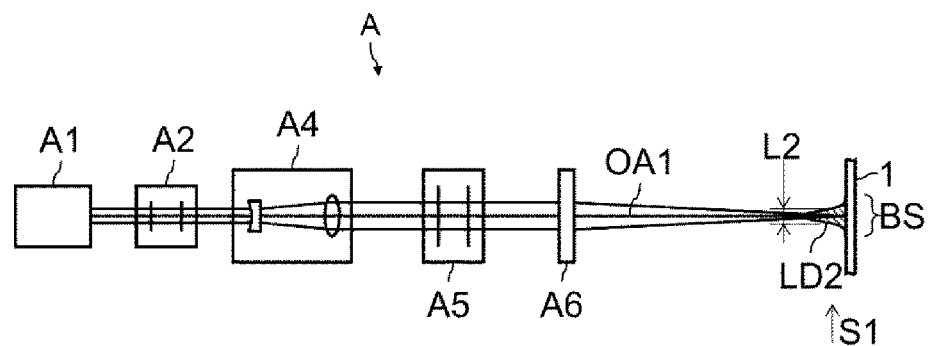

[FIG. 7]
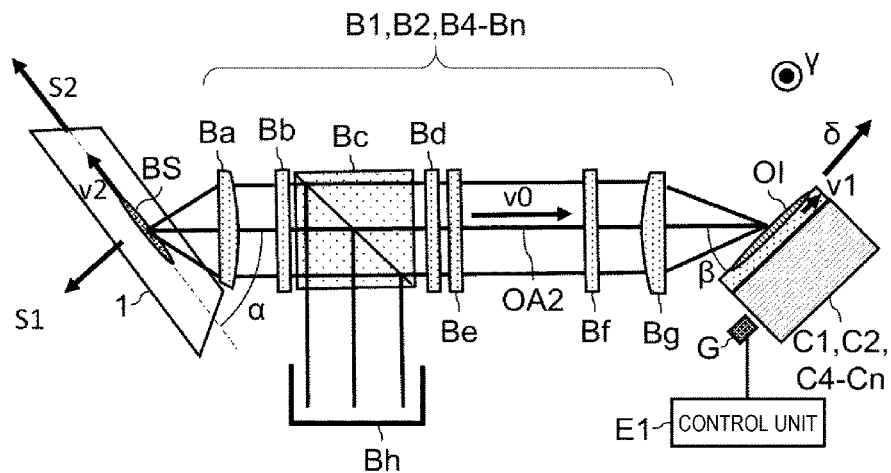
[FIG. 8]
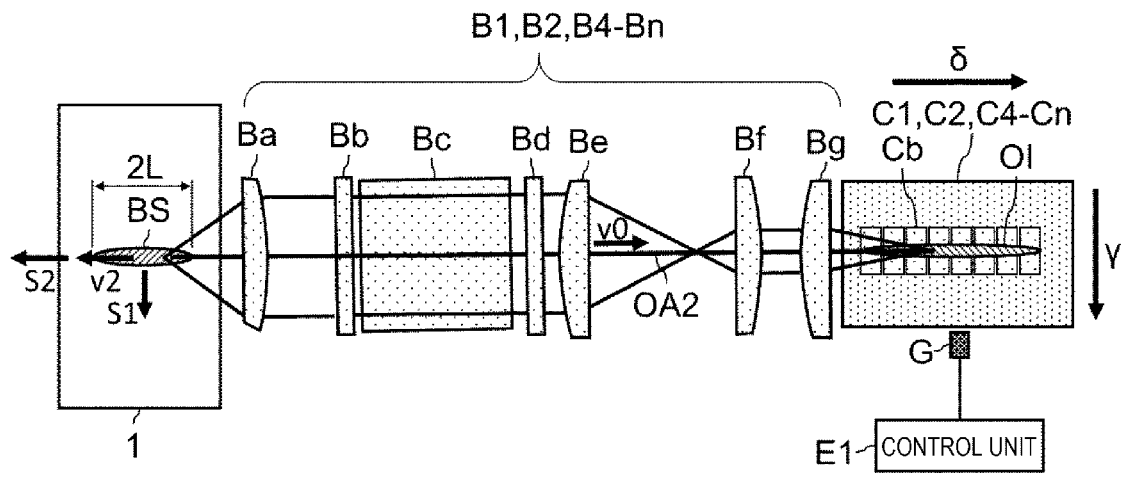
[FIG. 9]
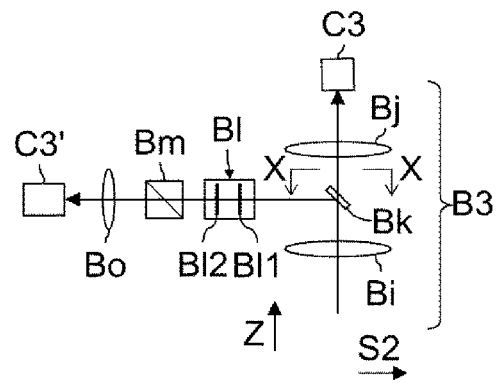

[FIG. 10]
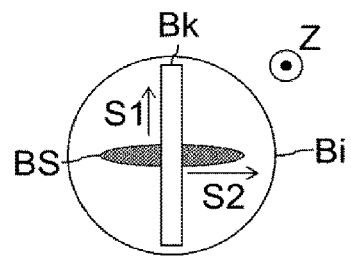
[FIG. 11]
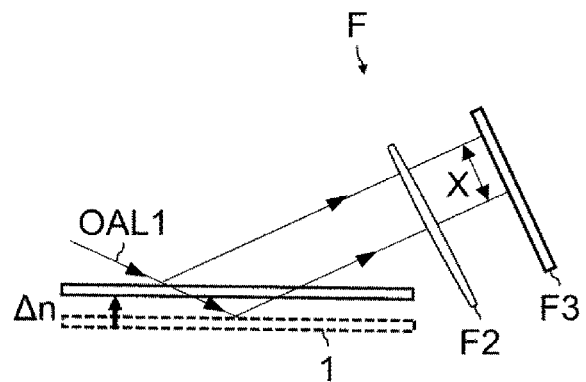
[FIG. 12]
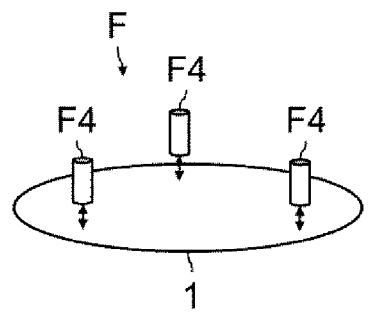

[FIG. 13]
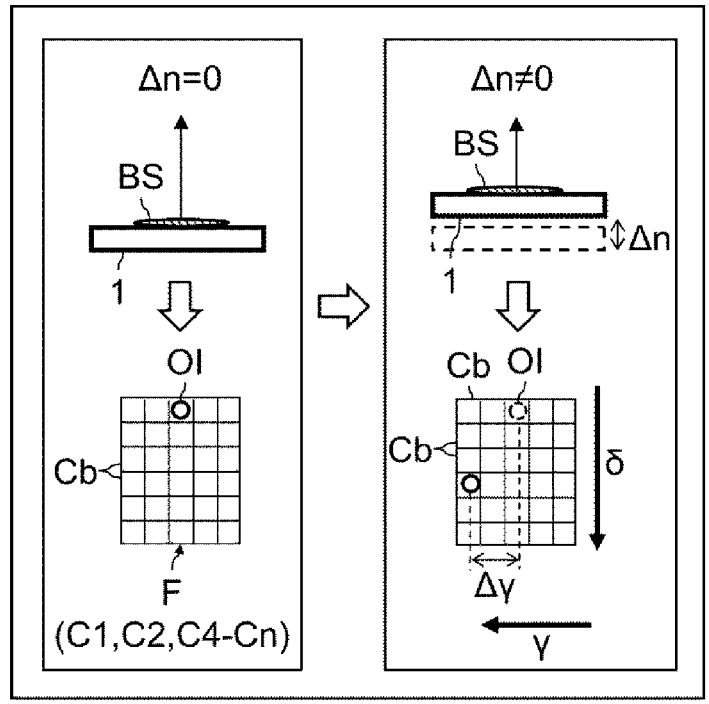
[FIG. 14]
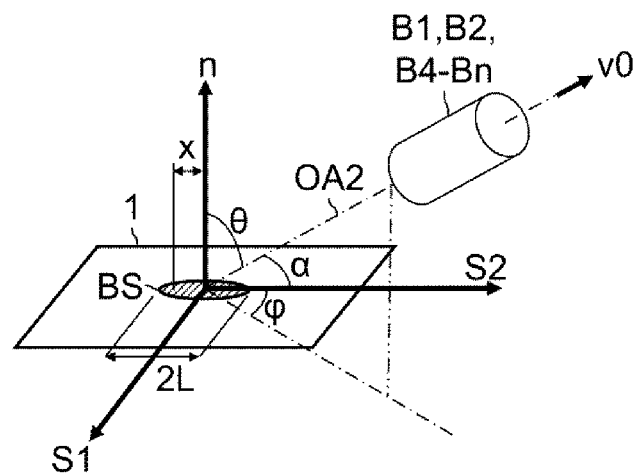

[FIG. 15]
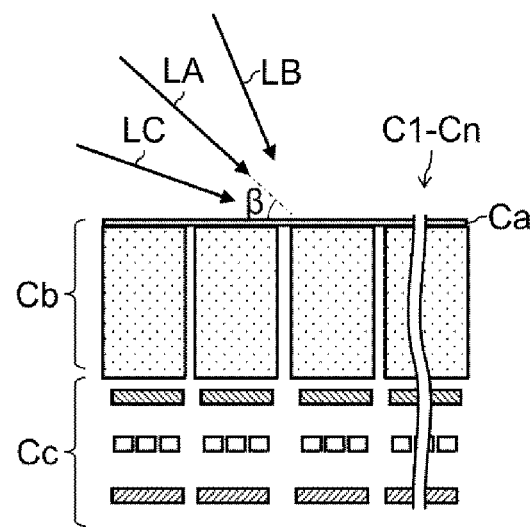
[FIG. 16]
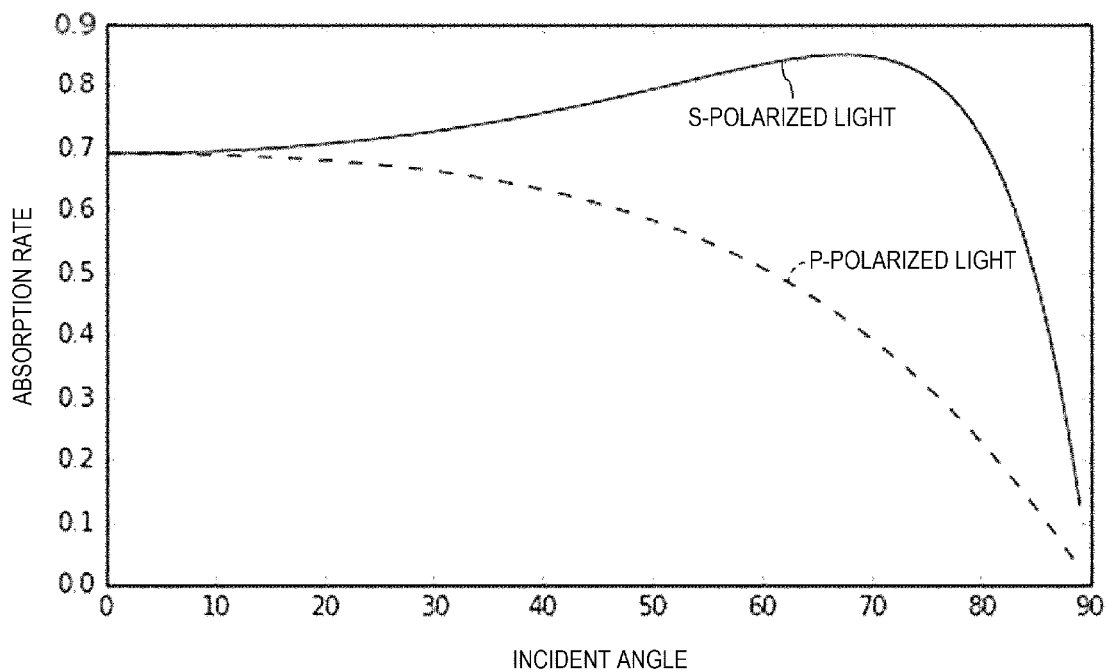

[FIG. 17]
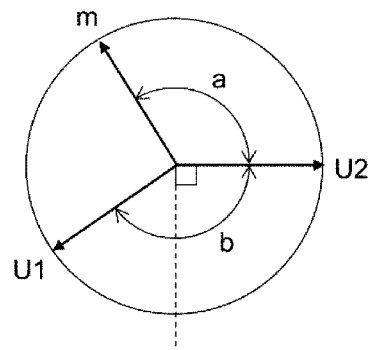
[FIG. 18]
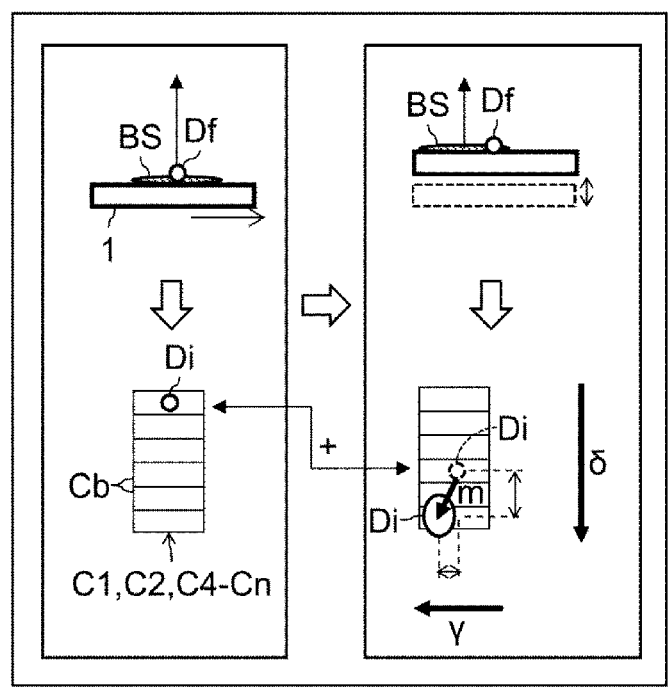
[FIG. 19]
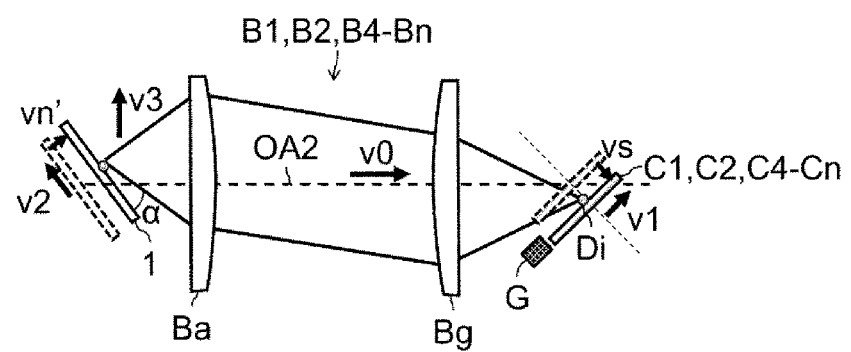

[FIG. 20]
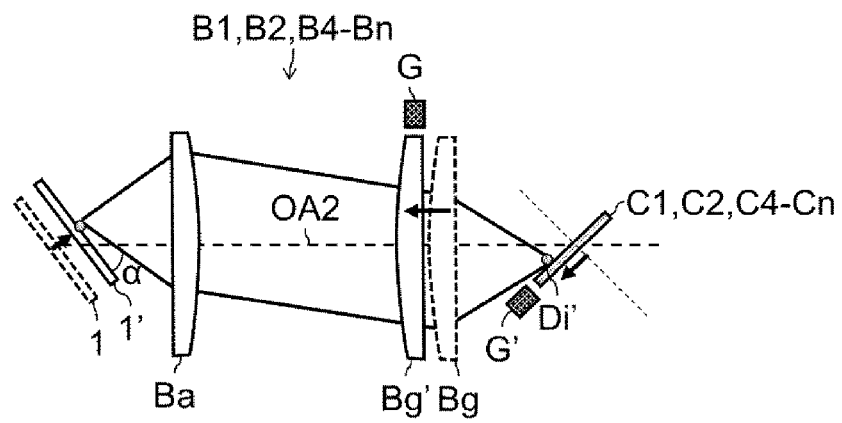
[FIG. 21]
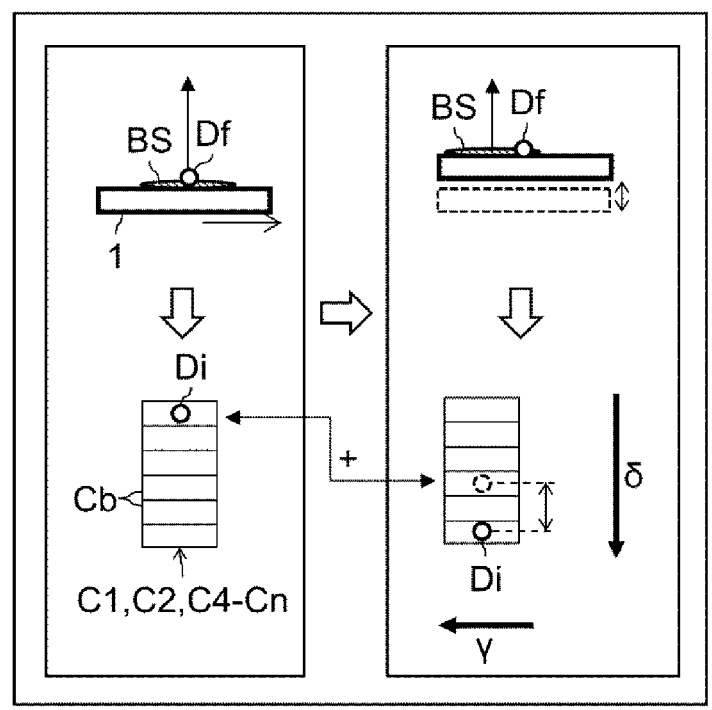

[FIG. 22]
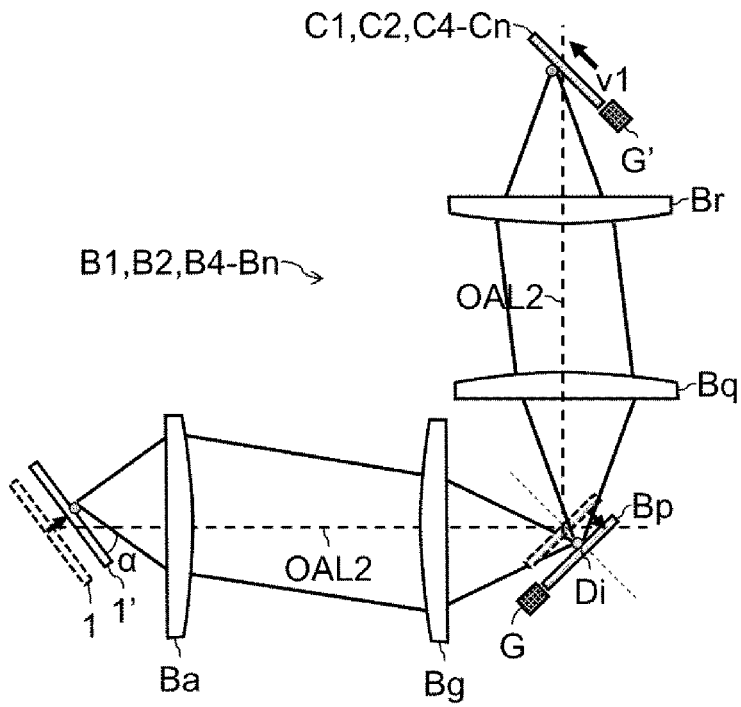
[FIG. 23]
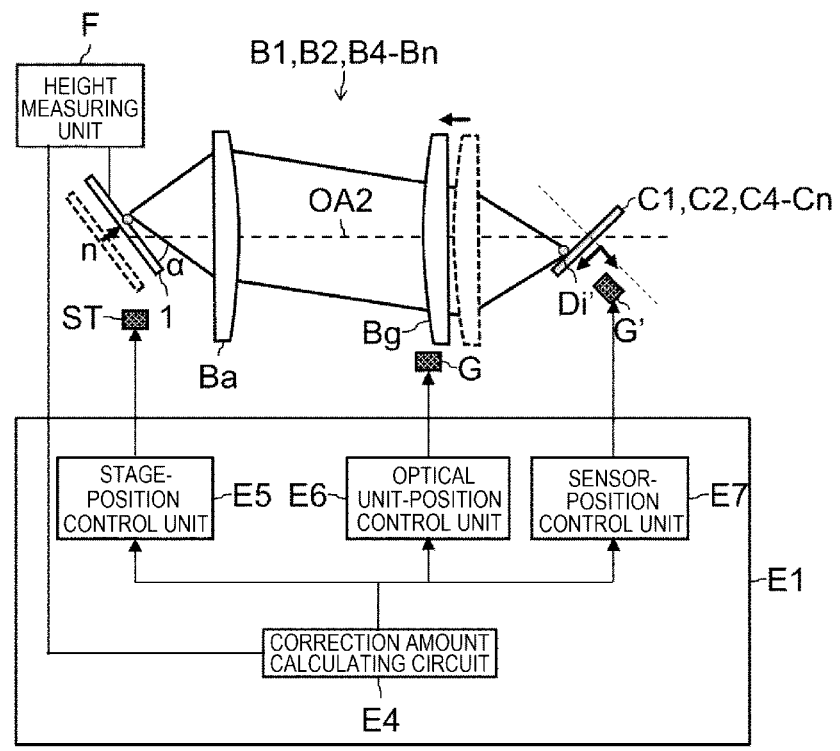

[FIG. 24]
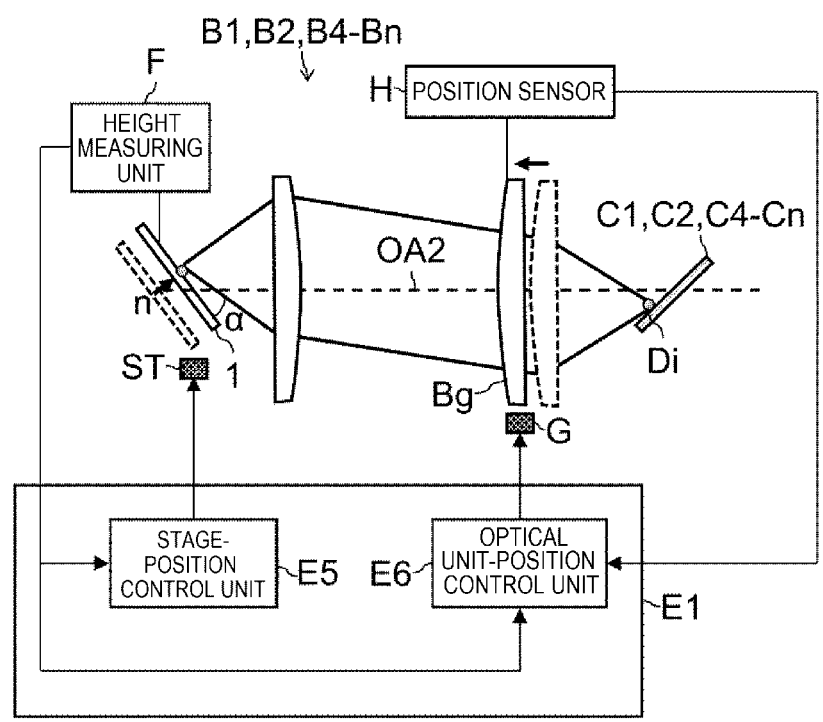

DEFECT INSPECTION DEVICE

TECHNICAL FIELD

The present invention relates to an optical defect inspection device that inspects a minute defect on a surface of a sample such as a semiconductor wafer substrate, and in particular, to a defect inspection device in which an illumination optical system and a detection optical system are inclined with respect to the sample surface.

BACKGROUND ART

In a manufacturing line of a semiconductor substrate, a thin film substrate, or the like, a defect present on a surface of a product is inspected in order to maintain or improve the yield of the product. In order to optically detect a minute defect, it is necessary to irradiate the defect with a large amount of illumination light, capture scattered light that is generated at the defect and small in amount as much as possible, and form an image on a light receiving surface of a sensor.

In PTL 1, a plurality of detection optical systems are arranged in a direction inclined with respect to a sample surface in order to detect scattered light generated at a defect, and an image of a linear illumination spot on the sample surface is imaged on a sensor of each of the detection optical systems to perform defect determination. However, when the detection optical systems are arranged to detect the image of the linear illumination spot obliquely, a difference occurs in an operating distance (a distance between each of the detection optical systems and the illumination spot) due to a position of the illumination spot. As a result, when the entire illumination spot does not fall within a depth of focus, a resolution of the image imaged on the sensor decreases. In order to suppress the decrease, it is described in PTL 1 that the sensor is inclined with respect to an optical axis of the detection optical system according to the inclination of the optical axis of the detection optical system with respect to the sample such that the light receiving surface of the sensor and the sample surface are conjugate with each other (paragraph 0042).

CITATION LIST

Patent Literature

PTL 1: JP2007-033433A

SUMMARY OF INVENTION

Technical Problem

In the method disclosed in PTL 1, a height variation of the sample surface that occurs during the inspection greatly affects an inspection result. During the inspection, the sample rotates at a high speed of several thousand rotations per minute (RPM), and a position of the sample varies in a height direction, that is, in a direction intersecting the sample surface due to a warpage of the sample, an air flow, a chuck of a sample stage, or a vibration of a rotational shaft. Such a height variation occurs at the same frequency as that of a rotation cycle of the sample at the maximum. When the height of the sample varies, the sample surface is deviated from a focus of the detection optical system, the resolution of the image decreases, the image is protruded from pixels, and a signal output by the sensor is degraded.

An object of the invention is to suppress a decrease in resolution caused by a height variation of a sample surface in a defect inspection device in which an optical axis of a detection optical system is inclined with respect to the sample surface.

Solution to Problem

In order to achieve the above object, the invention provides a defect inspection device, the defect inspection device includes: a sample stage configured to support a sample; an illumination optical system configured to form, on a surface of the sample, an illumination spot having a long axis; a detection optical system configured to condense scattered light of the illumination spot from the surface of the sample; an imaging sensor including a plurality of pixels and configured to output a data set of a scattered light intensity of an optical image of the illumination spot, the optical image of the illumination spot being imaged on a light receiving surface through the detection optical system; a height measuring unit configured to measure a height of the sample; a focus actuator configured to relatively move a focusing position of the optical image, which is determined by the detection optical system, with respect to the light receiving surface of the imaging sensor; and a computer configured to control the focus actuator according to an output of the height measuring unit. An optical axis of the detection optical system is inclined with respect to the surface of the sample, and the imaging sensor is inclined with respect to the optical axis of the detection optical system such that a long axis of the light receiving surface coincides with a position conjugate with the illumination spot. The computer is configured to calculate, based on the output of the height measuring unit, a height variation amount of the illumination spot in a normal direction of the surface of the sample; calculate, based on the height variation amount of the illumination spot, a deviation amount of the focusing position with respect to the light receiving surface in an optical axis direction of the detection optical system, the deviation amount of the focusing position being generated accompanying a height variation of the illumination spot; control, based on the deviation amount of the focusing position, the focus actuator to align the focusing position with the light receiving surface of the imaging sensor; and add scattered light intensities at the same coordinates of the sample among a plurality of the data sets for the optical images output from a plurality of the imaging sensors, or among a plurality of the data sets for the optical image output from the same imaging sensor when the illumination spot is scanned.

Advantageous Effects of Invention

According to the invention, it is possible to suppress a decrease in resolution caused by a height variation of a sample surface in a defect inspection device in which an illumination optical system and a detection optical system are inclined with respect to the sample surface.

BRIEF DESCRIPTION OF DRAWINGS

FIG. 1 is a schematic diagram of a configuration example of a defect inspection device according to a first embodiment of the invention.

FIG. 2 is a schematic diagram illustrating a scanning trajectory on a sample of a scanning device in the defect inspection device illustrated in FIG. 1.

FIG. 3 is a schematic diagram illustrating another example of the scanning trajectory on the sample.

FIG. 4 is a schematic diagram illustrating an attenuator provided in the defect inspection device illustrated in FIG. 1 in an extracted manner.

FIG. 5 is a schematic diagram illustrating a relation between an optical axis of illumination light, which is guided obliquely to a sample surface by an illumination optical system in the defect inspection device illustrated in FIG. 1, and an illumination intensity distribution shape.

FIG. 6 is a schematic diagram illustrating the relation between the optical axis of the illumination light, which is guided obliquely to the sample surface by the illumination optical system in the defect inspection device illustrated in FIG. 1, and the illumination intensity distribution shape.

FIG. 7 is a schematic diagram illustrating configurations of a detection optical system (an oblique optical system) and an imaging sensor that are provided in the defect inspection device illustrated in FIG. 1.

FIG. 8 is a schematic diagram illustrating configurations of the detection optical system (the oblique optical system) and the imaging sensor that are provided in the defect inspection device illustrated in FIG. 1.

FIG. 9 is a schematic diagram illustrating a configuration of the detection optical system (a vertical optical system) provided in the defect inspection device illustrated in FIG. 1.

FIG. 10 is a view taken along a line X-X in FIG. 9.

FIG. 11 is a diagram illustrating a principle for measuring a height variation of the sample surface by a height measuring unit F illustrated in FIG. 1.

FIG. 12 is a diagram of another example of the height measuring unit.

FIG. 13 is a diagram of still another example of the height measuring unit.

FIG. 14 is a schematic diagram of a three-dimensional arrangement of the sample and the detection optical system (the oblique optical system) in the defect inspection device illustrated in FIG. 1.

FIG. 15 is a cross-sectional view of the imaging sensor provided in the defect inspection device illustrated in FIG. 1.

FIG. 16 is a graph illustrating an example of properties of an antireflection film.

FIG. 17 is a diagram illustrating a displacement direction of an optical image along the light receiving surface of the imaging sensor accompanying a variation in a height of the illumination spot on the sample surface.

FIG. 18 is a diagram illustrating the displacement direction of the optical image along the light receiving surface of the imaging sensor accompanying the variation in the height of the illumination spot on the sample surface.

FIG. 19 is a diagram illustrating correction of a focus deviation and an image deviation caused by the height variation of the illumination spot in the defect inspection device according to the first embodiment of the invention.

FIG. 20 is a diagram illustrating correction of a focus deviation and an image deviation caused by a height variation of an illumination spot in a defect inspection device according to a second embodiment of the invention.

FIG. 21 is a diagram illustrating correction of a focus deviation and an image deviation caused by a height variation of an illumination spot in a defect inspection device according to a third embodiment of the invention.

FIG. 22 is a diagram illustrating correction of a focus deviation and an image deviation caused by a height variation of an illumination spot in a defect inspection device according to a fourth embodiment of the invention.

FIG. 23 is a diagram illustrating correction of a focus deviation and an image deviation caused by a height variation of an illumination spot in a defect inspection device according to a fifth embodiment of the invention.

FIG. 24 is a diagram illustrating correction of a focus deviation and an image deviation caused by a height variation of an illumination spot in a defect inspection device according to a sixth embodiment of the invention.

DESCRIPTION OF EMBODIMENTS

Hereinafter, embodiments of the invention will be described with reference to the drawings.

In the following embodiments, a defect inspection device to be described as an application target of the invention is used for defect inspection of a surface of a sample (a wafer) to be performed during a manufacturing process of a semiconductor or the like, for example. According to the defect inspection device according to each embodiment, it is possible to perform a process of detecting a minute defect, and acquiring data on the number of defects, a position, a size, and a type of the defect at high speed.

First Embodiment

—Defect Inspection Device—

FIG. 1 is a schematic diagram of a configuration example of a defect inspection device 100 according to the present embodiment. The defect inspection device 100 according to the present embodiment uses a sample 1 as an inspection target, and detects a defect such as a foreign matter or a recess on a surface of the sample 1 (hereinafter, referred to as the sample surface), in particular, a defect of a type corresponding to an inspection purpose. A typical example of the sample 1 is a disk-shaped semiconductor silicon wafer having a flat surface on which no pattern is formed. The defect inspection device 100 includes a stage ST, an illumination optical system A, detection optical systems B1 to Bn (n=1, 2, . . . ), imaging sensors C1 to Cn, C3' (n=1, 2, . . . ), a height measuring unit F, a signal processing device D, a control device E1, a user interface E2, and a monitor E3. Each of the signal processing device D and the control device E1 is a computer, and controls a focus actuator (an actuator G to be described later in the present embodiment) according to an output of the height measuring unit F. The signal processing device D and the control device E1 may be implemented by different computers, or may adopt a configuration of sharing a single computer.

—Stage—

The stage ST includes a sample stage ST1 and a scanning device ST2. The sample stage ST1 is a stage that supports the sample 1. The scanning device ST2 is a device that drives the sample stage ST1 to change relative positions of the sample 1 and the illumination optical system A, and includes a translation stage, a rotation stage, and a Z stage. The rotation stage is supported on the translation stage via the Z stage, and the sample stage ST1 is supported on the rotation stage. The translation stage is translated in a horizontal direction together with the rotation stage, and the rotation stage rotates about an axis extending vertically. The Z stage has a function of adjusting a height of the sample surface.

FIG. 2 is a schematic diagram illustrating a scanning trajectory of the scanning device ST2 on the sample 1. As will be described later, an illumination spot BS formed on the sample surface by illumination light emitted from the illumination optical system A has an illumination intensity distribution long in one direction as illustrated in FIG. 2. A long axis direction of the illumination spot BS (a radial direction of the sample stage ST1) is set to S2, and a direction substantially orthogonal to a long axis (a circumferential direction around a rotational shaft of the sample stage ST1) is set to S1. The sample 1 rotates with the rotation of the rotation stage, and the illumination spot BS is caused to scan in the direction S1 relative to the sample surface. In addition, the sample 1 moves in the horizontal direction with the translation of the translation stage, and the illumination spot BS is caused to scan in the direction S2 relative to the sample surface. When the sample 1 is translated while rotating due to an operation of the scanning device ST2, the illumination spot BS moves while drawing a spiral trajectory from a center to an outer edge of the sample 1 as illustrated in FIG. 2, and the entire surface of the sample 1 is scanned. The illumination spot BS moves in the direction S2 by only a distance equal to or shorter than a length of the illumination spot BS in the direction S2 during one rotation of the sample 1.

Note that it is also possible to apply a scanning device that includes another translation stage including an extended movement shaft in a direction where the extended movement shaft intersects a movement shaft of the translation stage within a horizontal plane, instead of the rotation stage. In this case, as illustrated in FIG. 3, the illumination spot BS is caused to scan the sample surface by folding a linear trajectory instead of along the spiral trajectory. Specifically, a first translation stage is driven to translate in the direction S1 at a constant speed, a second translation stage is driven in the direction S2 by a predetermined distance (for example, a distance equal to or shorter than a length of the illumination spot BS in the direction S2), and then the first translation stage is returned and is driven to translate in the direction S1 again. By repeating the linear scanning in the direction S1 and the movement in the direction S2 of the illumination spot BS in this manner, the entire surface of the sample 1 is scanned. As compared with this scanning method, the spiral scanning method illustrated in FIG. 2 does not involve a reciprocating operation, which is advantageous in executing the inspection of the sample in a short time.

—Illumination Optical System—

The illumination optical system A illustrated in FIG. 1 is an optical unit that includes a plurality of optical elements in order to irradiate the sample 1 placed on the sample stage ST1 with desired illumination light, and forms the illumination spot BS on the sample surface which is long in one direction (the direction S2) and has a long axis. As illustrated in FIG. 1, the illumination optical system A includes a laser light source A1, an attenuator A2, an emitted light adjusting unit A3, a beam expander A4, a polarized-beam control unit A5, a light condensing optical unit A6, reflection mirrors A7 to A9, and the like.

Laser Light Source

The laser light source A1 is a unit that emits a laser beam as the illumination light. A diameter of the laser beam emitted by the laser light source A1 is typically about 1 mm. In a case of detecting a minute defect in the vicinity of the sample surface by the defect inspection device 100, as the laser light source A1, a laser light source is used that oscillates a high-output laser beam having an output of 2 W or more by using ultraviolet light or vacuum ultraviolet light that has a short wavelength (for example, the wavelength is 355 nm or less) and is less likely to penetrate into the inside of the sample 1. In the present embodiment, for example, a laser beam having a wavelength of 266 nm is applied, and a laser beam having a wavelength corresponding to a purpose can be used among near ultraviolet light having a wavelength of 200 nm to 380 nm or vacuum ultraviolet light having a wavelength of 10 nm to 200 nm. In addition, in a case of detecting a defect inside the sample 1 by the defect inspection device 100, as the laser light source A1, a laser light source is used that oscillates a visible or infrared laser beam that has a long wavelength and permeates easily into the inside of the sample 1.

Attenuator

FIG. 4 is a schematic diagram illustrating the attenuator A2 in an extracted manner. The attenuator A2 is a unit that attenuates a light intensity of the illumination light from the laser light source A1, and in the present embodiment, a configuration in which a first polarizing plate A21, a ½ wavelength plate A22, and a second polarizing plate A23 are combined is illustrated. The ½ wavelength plate A22 is configured to rotate about an optical axis of the illumination light. The illumination light incident on the attenuator A2 is converted into a linearly polarized light by the first polarizing plate A21, then is adjusted in a polarization direction to an azimuth angle of a slow axis of the ½ wavelength plate A22, and passes through the second polarizing plate A23. By adjusting the azimuth angle by the ½ wavelength plate A22, the light intensity of the illumination light can be degraded at any ratio. When a linear polarization degree of the illumination light incident on the attenuator A2 is sufficiently high, the first polarizing plate A21 can be omitted. As the attenuator A2, an attenuator is used in which a relation between an input signal and a light dimming rate is calibrated in advance. The attenuator A2 is not limited to the configuration illustrated in FIG. 4, and may include a neutral density (ND) filter having a gradation density distribution. In this case, an attenuation effect can be adjusted by a combination of a plurality of ND filters having different densities.

Emitted Light Adjusting Unit

The emitted light adjusting unit A3 illustrated in FIG. 1 is a unit that adjusts an angle of the optical axis of the illumination light attenuated by the attenuator A2, and in the present embodiment, the emitted light adjusting unit A3 includes a plurality of reflection mirrors A31, A32. Although in this configuration, the illumination light is sequentially reflected by the reflection mirrors A31, A32, in the present embodiment, an incidence and emission plane of the illumination light with respect to the reflection mirror A31 is orthogonal to an incidence and emission plane of the illumination light with respect to the reflection mirror A32.

The incidence and emission plane is a plane including an optical axis incident on the reflection mirror and an optical axis emitted from the reflection mirror. For example, when a three-dimensional XYZ orthogonal coordinate system is defined and the illumination light is incident on the reflection mirror A31 in a +X direction, for example, a direction of the illumination light is changed to a +Y direction by the reflection mirror A31 and then is changed to a +Z direction by the reflection mirror A32, which is different from that of the schematic diagram in FIG. 1. The above is an example in which the incidence and emission plane of the illumination light with respect to the reflection mirror A31 is an XY plane, and the incidence and emission plane with respect to the reflection mirror A32 is an YZ plane.

Each of the reflection mirrors A31, A32 is provided with a mechanism (not shown) for translationally moving a corresponding one of the reflection mirrors A31, A32, and a mechanism (not shown) for tilting a corresponding one of the reflection mirrors A31 and A32. Each of the reflection mirrors A31, A32, for example, is translated in an incident direction or an emission direction of the illumination light with respect to the reflection mirror, and tilts around a normal line with the incidence and emission plane. Accordingly, for example, with respect to the optical axis of the illumination light emitted from the emitted light adjusting unit A3 in the +Z direction, an offset amount and an angle in an XZ plane, and an offset amount and an angle in the YZ plane can be independently adjusted. Although a configuration in which the two reflection mirrors A31, A32 are used is illustrated in this example, a configuration in which three or more reflection mirrors are used may be adopted.

Beam Expander

The beam expander A4 is a unit that enlarges a light beam diameter of the incident illumination light, and includes a plurality of lenses A41, A42. An example of the beam expander A4 can include a Galilean beam expander using a concave lens as the lens A41 and a convex lens as the lens A42. The beam expander A4 is provided with an interval adjustment mechanism (a zoom mechanism) for the lenses A41 and A42, and an enlargement ratio of the light beam diameter is changed by adjusting an interval between the lenses A41, A42. The enlargement ratio of the light beam diameter obtained by the beam expander A4 is, for example, about 5 to 10, and in this case, when assuming that a beam diameter of the illumination light emitted from the laser light source A1 is 1 mm, the beam system of the illumination light is enlarged to about 5 mm to 10 mm. When the illumination light incident on the beam expander A4 is not a parallel light beam, it is possible to perform collimation (quasi-parallelization of the light beam) by adjusting the interval between the lenses A41, A42 together with the change of the light beam diameter. However, for the collimation of the light beam, a configuration may be adopted in which a collimator lens is provided upstream of the beam expander A4 separately from the beam expander A4.

The beam expander A4 is provided in the translation stage having two axes (the degree of freedom is two) or more, and is configured to perform position adjustment such that the incident illumination light coincides with a center thereof. Further, the beam expander A4 may also have a function of adjusting a tilt angle in two axes (the degree of freedom is two) or more such that the incident illumination light and the optical axis coincide with each other.

Polarized-Beam Control Unit

The polarized-beam control unit A5 is an optical system that controls a polarization state of the illumination light, and includes a ½ wavelength plate A51 and a ¼ wavelength plate A52. For example, when the reflection mirror A7, which will be described later, is placed in an optical path and performs oblique-incidence illumination, by adjusting the illumination light into p-polarized light using the polarized-beam control unit A5, an amount of scattered light from a defect on the sample surface is increased as compared with that using polarized light rather than the p-polarized light. When the scattered light (referred to as a "haze") from minute irregularities on the surface of the sample itself hinders the detection of the minute defect, by adjusting the illumination light into s-polarized light, the haze can be reduced as compared with that using polarized light rather than the s-polarized light. It is also possible to set the illumination light into circularly polarized light or 45-degree polarized light between the p-polarized light and the s-polarized light by the polarized-beam control unit A5.

Light Condensing Optical Unit

The light condensing optical unit A6 is a unit that condenses the illumination light and adjusts an intensity distribution thereof, and includes optical elements such as an aspherical lens, a diffractive optical element, a cylindrical lens array, and a light pipe. As illustrated in FIG. 1, the optical elements constituting the light condensing optical unit A6 are provided perpendicular to the optical axis of the illumination light.

Reflection Mirror

As illustrated in FIG. 1, the reflection mirror A7 can be translated in an arrow direction by a drive mechanism (not shown), so as to enter and exit from the optical path of the illumination light traveling toward the sample 1, and can switch an incidence path of the illumination light with respect to the sample 1. When the reflection mirror A7 is inserted into the optical path, the illumination light emitted from the polarized-beam control unit A5 as described above is reflected by the reflection mirror A7 and is obliquely incident on the sample 1 via the light condensing optical unit A6 and the reflection mirror A8. On the other hand, when the reflection mirror A7 is removed from the optical path, the illumination light emitted from the polarized-beam control unit A5 is perpendicularly incident on the sample 1 via the reflection mirror A9, a polarized-beam splitter Bm, a polarized-beam control unit Bl, a reflection mirror Bk, and a detection optical system B3.

FIGS. 5 and 6 are schematic diagrams each illustrating a relation between the optical axis of the illumination light guided obliquely to the sample surface by the illumination optical system A, and an illumination intensity distribution shape. FIG. 5 schematically illustrates a cross section obtained by cutting the sample 1 on an incident surface of the illumination light incident on the sample 1. FIG. 6 schematically illustrates a cross section obtained by cutting the sample 1 on a surface orthogonal to the incident surface of the illumination light incident on the sample 1 and including a normal line of the sample surface. The incident surface is a surface including an optical axis OA1 of the illumination light incident on the sample 1 and the normal line of the sample surface. In FIGS. 5 and 6, a part of the illumination optical system A is extracted and illustrated, and for example, the emitted light adjusting unit A3 and the reflection mirrors A7, A8 are not shown.

When the reflection mirror A7 is inserted into the optical path, the illumination light emitted from the laser light source A1 is condensed by the light condensing optical unit A6, is adjusted to a desired intensity distribution, and is reflected by the reflection mirror A8 and obliquely incident on the sample 1. As described above, the illumination optical system A is configured to allow the illumination light to be incident on the sample 1 from a direction inclined with respect to the normal line of the sample surface. Regarding the oblique-incidence illumination, the light intensity is adjusted by the attenuator A2, the light beam diameter is adjusted by the beam expander A4, the polarized light is adjusted by the polarized-beam control unit A5, and the intensity distribution is adjusted by the light condensing optical unit A6, and the illumination intensity distribution is made uniform in the incident surface. As in an illumination intensity distribution (an illumination profile) LD1 illustrated in FIG. 5, the illumination spot formed on the sample 1 has a light intensity distribution of a Gaussian shape in the direction S2. A beam width L1 in the direction S2 defined by a peak of 13.5% is, for example, about 5 μm to 4 mm.

In a surface orthogonal to the incident surface and the sample surface, as in an illumination intensity distribution (an illumination profile) LD2 illustrated in FIG. 6, the illumination spot has a light intensity distribution in which the intensity in a periphery is weak with respect to that in a center of the light beam. Specifically, the light intensity distribution is a Gaussian distribution that reflects the intensity distribution of the light incident on the light condensing optical unit A6, or an intensity distribution that is similar to a first-kind first-order Bessel function or a sinc function reflecting an aperture shape of the light condensing optical unit A6. A length L2 of the illumination intensity distribution in the surface orthogonal to the incident surface and the sample surface is set to be shorter than the beam width L1 illustrated in FIG. 5 in order to reduce the haze generated from the sample surface, and is set to, for example, about 1.0 µm to 10 µm. The length L2 of the illumination intensity distribution is a length of a region having an illumination intensity that is 13.5% or more of a maximum illumination intensity in the surface orthogonal to the incident surface and the sample surface.

Further, an incident angle of the oblique-incidence illumination with respect to the sample 1 (an inclination angle of an incident optical axis with respect to the normal line of the sample surface) is adjusted to an angle suitable for the detection of the minute defect by using positions and angles of the reflection mirrors A7, A8. The angle of the reflection mirror A8 is adjusted by an adjustment mechanism A81. For example, as the incident angle of the illumination light with respect to the sample 1 increases (as an illumination elevation angle that is an angle formed by the sample surface and the incident optical axis decreases), the haze that is noise with respect to the scattered light from a fine foreign matter on the sample surface is degraded, which is suitable for the detection of the minute defect. From the viewpoint of suppressing an influence of the haze on the detection of the minute defect, the incident angle of the illumination light is preferably set to, for example, 75 degrees or more (the elevation angle is 15 degrees or less). On the other hand, in the oblique-incidence illumination, as the illumination incident angle decreases, an absolute amount of the scattered light from the fine foreign matter increases, and therefore, from the viewpoint of aiming at an increase in an amount of the scattered light from the defect, the incident angle of the illumination light is preferably set to, for example, 60 degrees more and 75 degrees or less (the elevation angle is 15 degrees or more and 30 degrees or less).

—Detection Optical System—

Each of the detection optical systems B1 to Bn (n=1, 2, . . . ) is an optical unit that condenses the scattered light of the illumination spot BS from the sample surface, and includes a plurality of optical elements including a condenser lens (an objective lens). Further, n of the detection optical system Bn represents the number of detection optical systems. The objective lenses of the detection optical systems B1 to Bn are arranged along a hemispherical surface of an upper half of a sphere (a celestial sphere) centered on the illumination spot BS for the sample 1. The scattered light incident on the detection optical systems B1 to Bn is individually condensed and guided to the corresponding imaging sensors C1 to Cn. In the present embodiment, the scattered light incident on the detection optical system B3 is branched in the optical path by the reflection mirror Bk, and is also guided to the imaging sensor C3' in addition to the imaging sensor C3.

Oblique Optical System

FIGS. 7 and 8 are schematic diagrams each illustrating configurations of the detection optical systems B1, B2, and B4 to Bn and the imaging sensors C1, C2, and C4 to Cn. That is, FIGS. 7 and 8 are schematic diagrams of the detection optical systems in which the optical axis is inclined with respect to the sample surface. FIG. 7 schematically illustrates a cross section (a view seen in a −Y direction in FIG. 1) obtained by cutting the detection optical systems on a reflection surface where the scattered light incident on the detection optical system is reflected by the sample 1. FIG. 8 is a schematic diagram of the detection optical systems viewed from a direction intersecting the optical axis of the detection optical system along the reflection surface (a view seen in a −Z direction of FIG. 1). The reflection surface is a surface that includes an optical axis OA2 of the scattered light incident on the detection optical systems and the normal line of the sample surface. Hereinafter, the detection optical systems B1, B2, and B4 to Bn whose the optical axis OA2 is inclined with respect to the sample surface, and the imaging sensors C1, C2, and C4 to Cn are abbreviated as "the detection optical systems B1 . . . " and "the imaging sensors C1 . . . ".

As illustrated in FIGS. 7 and 8, each of the detection optical systems B1 . . . is a both-side telecentric optical system in which an imaging magnification does not change even when the operating distance changes. Each of the detection optical systems B1 . . . includes a condenser lens (an objective lens) Ba, a ½ wavelength plate Bb, a polarized-beam splitter Bc, a ½ wavelength plate Bd, cylindrical lenses Be, Bf, and an imaging lens Bg along the optical axis OA2. The illumination scattered light incident on the detection optical systems B1 . . . is guided to the imaging sensor C1. Each of the detection optical systems B1 . . . also includes a beam diffuser Bh in a traveling direction of the light separated by the polarized-beam splitter Bc.

In each of the detection optical systems B1 . . . , the illumination scattered light is condensed by the condenser lens Ba, and a polarization direction thereof is controlled by the ½ wavelength plate Bb. The ½ wavelength plate Bb is rotatable by an actuator (not shown). The light that passes through the ½ wavelength plate Bb is branched in the optical path by the polarized-beam splitter Bc according to the polarized light. By the combination of the ½ wavelength plate Bb and the polarized-beam splitter Bc, an optical signal indicating the defect of the sample 1 and an optical signal (roughness scattered light from the sample surface) that inhibits the defect detection of the sample 1 are easily separated from each other. The light that passes through the polarized-beam splitter Bc is controlled by the ½ wavelength plate Bd to a polarization direction suitable for the detection of the imaging sensor C1. On the other hand, the light branched in the optical path by the polarized-beam splitter Bc is attenuated by the beam diffuser Bh so as not to become stray light.

A cross-sectional shape of the light that passes through the ½ wavelength plate Bd is adjusted by the cylindrical lenses Be, Bf. The cylindrical lenses Be, Bf constitute a cylindrical beam expander, and a spread of an optical image OI imaged on the light receiving surface of the imaging sensor C1 in a transverse direction γ is adjusted to be smaller than a spread of the optical image OI in a longitudinal direction δ. The light receiving surface of the imaging sensor C1 coincides with a position conjugate with the illumination spot BS formed on the sample surface in the longitudinal direction δ, whereas the light receiving surface is not necessarily conjugate with the illumination spot BS in the transverse direction γ. However, the transverse direction γ of the light receiving surface coincides with the transverse direction of the optical image OI, and by reducing an image height (a width) of the optical image OI in the transverse direction γ by the cylindrical lenses Be, Bf, a focus deviation hardly occurs in the transverse direction γ. The light beam whose cross-sectional shape is adjusted by the cylindrical lenses Be, Bf in this way is guided to the imaging sensor C1 via the imaging lens Bg, and the optical image OI of the illumination spot BS is imaged on a plurality of pixels of the imaging sensor C1. A detection signal of the optical image photoelectrically converted by the pixels of the imaging sensor C1 is output to the signal processing device D.

In this manner, each of the detection optical systems B1 to Bn condenses the scattered light of the illumination spot BS formed on the sample 1 by the illumination optical system A, controls the polarization state of the incident scattered light, and forms the optical image of the illumination spot BS on the light receiving surface of the corresponding one of the imaging sensors C1 to Cn.

Vertical Optical System

FIG. 9 is a configuration diagram of the detection optical system B3 on which the scattered light emitted from the sample 1 in the normal direction is incident, and FIG. 10 is a view taken along a line X-X in FIG. 9. The detection optical system B3 includes a condenser lens (an objective lens) Bi and an imaging lens Bj, and guides the scattered light condensed by the condenser lens Bi to the imaging sensor C3 by the imaging lens Bj. In the detection optical system B3, the reflection mirror Bk is disposed at a position of a pupil of a user between the condenser lens Bi and the imaging lens Bj. During vertical illumination in which the reflection mirror A7 is removed from the optical path, the illumination light is incident on the sample 1 from the normal direction via the reflection mirror Bk. In this way, the condenser lens Bi of the detection optical system B3 also serves as a condenser lens that guides the vertical illumination to the sample 1.

On the other hand, the reflection mirror Bk also has a function of branching a part of the optical path of the scattered light incident on the detection optical system B3 from the illumination spot BS formed by the oblique-incidence illumination or the vertical illumination. It has been described above that the illumination spot BS has a linear intensity distribution that is long in the direction S2. As illustrated in FIG. 10, when viewed from the imaging sensor C3, the reflection mirror Bk is longer than the illumination spot BS in a short axis direction (the direction S1) of the linear illumination spot BS, and is shorter than the illumination spot BS in the long axis direction (the direction S2) of the illumination spot BS. Accordingly, the scattered light, which is incident on the detection optical system B3 from the sample 1 and does not interfere with the reflection mirror Bk, is incident on the imaging sensor C3 via the imaging lens Bj, and the scattered light that interferes with the reflection mirror Bk is reflected by the reflection mirror Bk.

The scattered light, which is incident on the detection optical system B3 from the sample 1 and is reflected by the reflection mirror Bk, is guided to the imaging sensor C3' via the polarized-beam control unit Bl, the polarized-beam splitter Bm, and an imaging lens Bo. Similar to the polarized-beam control unit A5, the polarized-beam control unit Bl includes a ¼ wavelength plate B11 and a ½ wavelength plate B12, and can adjust the illumination scattered light incident from the reflection mirror Bk to any polarized light. During the oblique-incidence illumination, the polarized light of the illumination scattered light incident on the polarized-beam splitter Bm is controlled to be the linearly polarized light by the ¼ wavelength plate B11 of the polarized-beam control unit Bl such that the illumination scattered light reflected by the reflection mirror Bk passes through the polarized-beam splitter Bm and is incident on the imaging lens Bo. Under a condition of the vertical illumination in which the reflection mirror A7 is removed from the optical path, the polarized light of the illumination light can be controlled by the polarized-beam control unit Bl such that the illumination light traveling toward the sample 1 is incident on the detection optical system B3 in a form of polarized light in any direction (for example, the circularly polarized light).

—Imaging Sensor—

The imaging sensors C1 to Cn are lines each having a light receiving surface in which a plurality of pixels are arranged in a row (an array shape), and correspond to the detection optical systems B1 to Bn, respectively. As the imaging sensors C1 to Cn, complementary metal-oxide-semiconductor (CMOS) sensors or charge coupled device (CCD) sensors are used. Each of the imaging sensors C1 to Cn photoelectrically converts the optical image of the illumination spot BS imaged on the light receiving surface by the corresponding detection optical system to perform predetermined sampling, converts an analog electric signal into digital data, and outputs the digital data as a data set of the scattered light intensity of the optical image to the signal processing device D.

In the present embodiment, the light receiving surface of each of the imaging sensors C1 to Cn is inclined with respect to the optical axis OA2 according to the inclination of the optical axis OA2 of the corresponding detection optical system with respect to the sample surface (to be described later), and the long axis of the light receiving surface coincides with the position conjugate with the illumination spot BS formed on the sample surface. However, the imaging sensor C3 that directly faces the illumination spot BS in the normal direction of the sample surface is excluded. The light receiving surface of the imaging sensor C3 is orthogonal to the optical axis OA2 of the detection optical system B3. The imaging sensors C1 to Cn are arranged such that the long axis (a center line extending in the longitudinal direction) of each light receiving surface and a long axis of the optical image OI (FIG. 7) of the illumination spot BS are parallel to each other, and the entire illumination spot BS is contained in the one-dimensional light receiving surface formed by arranging the pixels in an array.

Further, in the defect inspection device 100, the actuator G for moving the imaging sensors C1 to Cn is provided for each of the imaging sensors C1 to Cn. As the actuator G, for example, a piezoelectric actuator can be used, a corresponding sensor can be shifted with good response, and the corresponding sensor can be translated three-dimensionally, for example. In the present embodiment, the actuator G serves as a focus actuator that relatively moves the focusing position of the optical image obtained by the corresponding detection optical system with respect to the light receiving surface of the corresponding imaging sensor.

Further, a part of the scattered light condensed by the detection optical system B3 is also guided to the imaging sensor C3' in addition to the imaging sensor C3 as described above. As the imaging sensor C3', a two-dimensional CCD imaging sensor, a CMOS imaging sensor, or a position sensing detector (PSD) is used. The imaging sensor C3' also photoelectrically converts the optical image condensed by the detection optical system B3, performs the predetermined sampling, converts an electric signal into digital data by analog/digital conversion, and outputs the digital data to the signal processing device D.

—Height Measuring Unit—

The height measuring unit F illustrated in FIG. 1 is a unit for measuring the height of the illumination spot BS on the sample surface, and includes a condenser lens F1, an imaging lens F2, and a two-dimensional sensor F3. As the two-dimensional sensor F3, a two-dimensional CCD imaging sensor, a CMOS imaging sensor, or a position sensing detector (PSD) is used. The two-dimensional sensor F3 photoelectrically converts the optical image imaged on the light receiving surface by the condenser lens F1 and the imaging lens F2, converts an electric signal into digital data by analog/digital conversion, and outputs the digital data to the control device E1. An output of the height measuring unit F may be input to the signal processing device D, and may be input to the control device E1 via the signal processing device D.

FIG. 11 is a diagram illustrating a principle for measuring a height variation of the sample surface by the height measuring unit F illustrated in FIG. 1. In FIG. 11, a case where the sample 1 is varied by Δn in the normal direction of the sample surface is shown. The condenser lens F1 is not shown. Specularly reflected light of the illumination light obliquely incident on the sample 1 at an elevation angle θ is incident on the two-dimensional sensor F3 through the imaging lens F2. Therefore, when the height of the sample 1 varies from a position indicated by a broken line to a position indicated by a solid line, a trajectory of the specularly reflected light is translated, and an incident position of the specularly reflected light with respect to the two-dimensional sensor F3 changes. In the two-dimensional sensor F3, an electric signal from a pixel on which the specularly reflected light is incident, that is, an electric signal corresponding to the incident position of the specularly reflected light is output from the two-dimensional sensor F3. By setting, as a reference, an incident position of the specularly reflected light when the illumination spot BS on the sample 1 is at a reference height (when the height variation Δn=0), a height variation amount of the illumination spot BS can be measured based on a deviation from the reference of the incident position accompanying the height variation of the illumination spot BS on the sample 1. Specifically, when a deviation amount from the reference of the incident position of the specularly reflected light with respect to the two-dimensional sensor F3 is set to X, since a relation X=2·Δn·cos θ is established as can be seen from FIG. 11, it is possible to calculate Δn using a value of X by the control device E1 based on this relational equation. It is needless to say that this X is different from X of the XYZ coordinate system.

—Another Example of Height Measuring Unit—

FIG. 12 is a diagram illustrating another example of the height measuring unit F. The height measuring unit F illustrated in FIG. 12 includes three or more displacement sensors F4. As the displacement sensor F4, a non-contact type distance meter using light or ultrasonic waves can be used. The height and the inclination of the sample surface can be specified by measuring heights of three or more points on the sample surface by these displacement sensors F4, and the height variation amount of the illumination spot BS on the sample surface can be measured by the control device E1 based on outputs of the displacement sensors F4.

—Still Another Example of Height Measuring Unit—

FIG. 13 is a diagram illustrating still another example of the height measuring unit F. An example in FIG. 13 is an example in which a two-dimensional sensor is adopted for each of the imaging sensors C1 to Cn (except for the imaging sensor C3) corresponding to the oblique optical system, and the two-dimensional sensors also serve as the height measuring unit F. A computer (for example, the signal processing device D or the control device E1) calculates the height variation amount of the illumination spot BS based on the position of the optical image in the transverse direction γ of the light receiving surface of each of the imaging sensors C1 . . . . The optical image OI illustrated in FIG. 13 represents a specific portion (for example, a center or an end portion in the longitudinal direction) of the optical image.

When the height of the sample 1 varies, a position of the optical image OI of the imaging sensor C1 is shifted along the light receiving surface of the imaging sensor C1 and the light receiving surface in the transverse direction γ of the optical image OI, as to be described later. A shift amount Δγ of the optical image OI in the transverse direction γ is represented by Equation (8) to be described later. By setting, as a reference, a position of the optical image OI when the illumination spot BS on the sample surface is at the reference height (when the height variation Δn=0), the shift amount Δγ in the transverse direction γ of the optical image OI can be measured by the computer. Accordingly, the height variation Δn of the illumination spot BS on the sample 1 can be calculated by the computer.

—Signal Processing Device—

The signal processing device D illustrated in FIG. 1 is a computer that processes detection signals received from the imaging sensors C1 to Cn, C3', and includes a CPU or FPGA, a timer, and the like in addition to a ROM, a RAM, and other memories. As an example, the signal processing device D is assumed to be implemented by a single computer that forms a unit together with a device main body (the stage, the illumination optical system, the detection optical system, the sensor, and the like) of the defect inspection device 100, but the signal processing device D may include a plurality of computers. In this case, a server may be used as one of the plurality of computers, which is an example in which the server is included in constituent elements of the defect inspection device 100. For example, a configuration may be adopted in which the detection signal of the defect from the device main body is acquired by the computer attached to the device body, detection data is processed as necessary and is transmitted to the server, and processes such as the detection and classification of the defect is executed by the server.

The signal processing device D includes an illumination spot position analyzing circuit D1, a memory D2, a signal integration circuit D3, and a defect detecting circuit D4. The illumination spot position analyzing circuit D1, the signal integration circuit D3, and the defect detecting circuit D4 are, for example, programs.

The illumination spot position analyzing circuit D1 analyzes the position of the illumination spot BS based on the digital data received from the imaging sensors C1 to Cn, C3'. The memory D2 stores the digital data received from the imaging sensors C1 to Cn, C3', position data calculated by the illumination spot position analyzing circuit D1, and the like, and stores the data as scattered light data. The signal integration circuit D3 performs, based on the scattered light data stored in the memory D2, integration arithmetic of a plurality of pieces of scattered light data in which the positions of the illumination spot BS are different and which are output from the same sensor, and performs, for different sensors, integration arithmetic of the scattered light data obtained by integration arithmetic similar to the above. The defect detecting circuit D4 extracts, based on the scattered light data after the integration arithmetic, a site having a high frequency and a high luminance on the sample surface as a defect. Each of the circuits of the signal processing device D may be implemented by, for example, an FPGA. Further, at least a part of functions of these circuits (in particular, a process of a downstream step) may also be executed by the server.

The process performed by the signal integration circuit D3 will be further description below. In the signal combining circuit D3, the scattered light intensities, at the same coordinates on the sample surface, of a plurality of pieces of data obtained by scanning in the longitudinal direction of the linear illumination spot BS on the sample 1 are added to each other. That is, in a case where the sample 1 is scanned in a spiral manner, when the coordinates on the sample surface are represented by a rθ coordinate system, the scattered light intensities, at the same coordinates, of a plurality of pieces of scattered light data whose θ coordinates are the same but r coordinates are different from each other are added to each other. The r coordinate in the rθ coordinate system is a radial direction coordinate on the sample surface, the θ coordinate is an azimuth angle coordinate on the sample surface, and is a concept different from that of the elevation angle θ in FIG. 11. Even the plurality of pieces of scattered light data are output from the same sensor, regarding the plurality of pieces of data having different r coordinates, an imaging position of the scattered light from the same coordinates (that is, a pixel for receiving the scattered light from the same coordinates) is deviated by a movement amount of the sample stage ST1 during one rotation of the sample 1. Therefore, based on the movement amount of the sample stage ST1, a correspondence relation with each of pixels serving as an output source for a signal to be added as the scattered light intensity at the same coordinates is calculated.

—Control Device—

The control device E1 is a computer that collectively controls the defect inspection device 100, and similar to the signal processing device D, includes a CPU or FPGA, a timer, and the like in addition to a ROM, a RAM, and other memories. The control device E1 is connected to the user interface E2, the monitor E3, and the signal processing device D in a wired or wireless manner. The control device E1 may have a function of the signal processing device D, and the control device E1 may also serve as the signal processing device D. The user interface E2 is a device that allows a user to input various operations, and various input devices such as a keyboard, a mouse, and a touch panel can be appropriately adopted.

The control device E1 receives an output of the height measuring unit F, encoders of the rotation stage and the translation stage, and an inspection condition or the like received from the user interface E2 in response to an operation of an operator. Examples of the inspection conditions include a type, a size, a shape, a material, an illumination condition, a detection condition, and the like of the sample 1. The control device E1 further outputs a signal for instructing operations of the actuator G, the detection optical systems B1 to Bn, the stage ST, and the illumination optical system A, and outputs coordinate data of the illumination spot BS synchronized with the detection signal of the defect to the signal processing device D according to the height variation and the inspection condition of the sample 1. In addition, the control device E1 display-outputs an inspection result of the defect obtained by the signal processing device D on the monitor E3. Although not shown, a defect review-scanning electron microscope (DR-SEM) that is an electron microscope for defect inspection may be connected to the control device E1. In this case, data on the inspection result of the defect from the DR-SEM can be received by the control device E1 and can also be transmitted to the signal processing device D.

—Various Settings—

FIG. 14 is a schematic diagram of a three-dimensional arrangement of the sample 1 and the oblique optical system. The optical axis OA2 of each of the detection optical systems B1 . . . is inclined at an angle θ with respect to the normal line (a normal direction n) of the sample 1. A projection of the optical axis OA2 on the sample surface is inclined at an angle φ with respect to the long axis (the direction S2) of the illumination spot BS. In the description of the application, θ described in and after this paragraph represents the inclination angle of the optical axis OA2 of the oblique optical systems with respect to the normal line of the sample surface, and is a concept different from that of θ representing the elevation angle of the illumination light in FIG. 11 and that of θ in the rθ coordinate system described above.

When the optical axis OA2 of each of the detection optical systems B1 . . . is inclined at the angle θ with respect to the normal line of the sample 1 and the projection of the optical axis OA2 on the sample surface is inclined at the angle φ with respect to the long axis of the illumination spot BS, in a three-dimensional space, a vector v0 of the optical axis OA2 is represented by the following Equation (1).

$$v0 = (\sin\theta \cdot \sin\varphi, \sin\theta \cdot \cos\varphi, \cos\theta) \quad (1)$$

An angle α formed by the vector v0 and the long axis (the direction S2) of the illumination spot BS is obtained by Equation (2).

$$\alpha = \arccos(\sin\theta \cdot \cos\varphi) \quad (2)$$

At this time, under a condition that the height of the sample surface is at a reference position, the optical image OI of the illumination spot BS is contained in the light receiving surface of the imaging sensor C1 without correcting the positions of the optical systems or the sensors. At this time, when assuming that a length of the long axis of the illumination spot BS is 2 L, a difference Δz represented by Equation (3) is generated in the operating distance (a distance between the sample 1 and each of the detection optical systems B1 . . . ) between a center of a field of view and a point separated by a distance x from the center of the field of view on the sample surface.

$$\Delta z = x(\sin\theta \cdot \cos\varphi), |x| < L \quad (3)$$

Further, an imaging magnification M is determined by the condenser lens Ba and the imaging lens Bg. When using the imaging magnification M, a position of the point, which is separated by the distance x from the center of the field of view on the sample surface, on the optical image OI on the light receiving surface of the imaging sensor C1 is represented by Equation (4).

$$\Delta Z = M^2 x(\sin\theta \cdot \cos\varphi), |x| < L \quad (4)$$

In general, the line sensors are arranged such that the light receiving surfaces thereof are orthogonal to a center line (the optical axis) of the light beam emitted by the imaging lens. On the other hand, in the present embodiment, as illustrated in FIG. 7, the light receiving surface of each of the imaging sensors C1 . . . is inclined with respect to the optical axis OA2, and an optical image with no focus deviation is detected irrespective of the difference Δz in the operating distance that is generated in the fields of view of the detection optical systems B1 . . . that are oblique optical systems. A vector v1 of the long axis (the center line extending in the longitudinal direction) of the light receiving surface is contained in the same plane together with a vector v2 (the direction S2) of the long axis of the illumination spot BS and the vector v0 of the optical axis OA2, and is set such that an angle β with respect to the vector v0 satisfies Equation (5).

$$\tan \alpha = M \cdot \tan \beta \quad (5)$$

At this time, the angle α is an angle formed by the vectors v0 and v2, and a relation cos α=sin θ·cos φ is established. When the imaging magnification M increases, the angle β formed by the vectors v0 and v1 decreases according to Equation (5), and an incident angle of reflected light with respect to the imaging sensor C1 increases. When the imaging magnification is increased to M=2, the scattered light is incident on the imaging sensor C1 at an incident angle close to 90 degrees at the maximum. However, an absorption rate of an antireflection film Ca (FIG. 15) of the imaging sensor C1 depends on an incident angle of the light, and the absorption rate decreases at the incident angle close to 90 degrees, so that the imaging magnification M is set to be 2 times or less.

Here, regarding the light beam of the scattered light incident on the condenser lens Ba, the spread of the light beam emitted to the imaging sensor C1 is a value obtained by multiplying the spread of the light beam emitted to the imaging lens Bg by a reciprocal of the imaging magnification M. As described above, since the imaging magnification M is set 2 times or less, in particular, when a lens having a large numerical aperture of an incident light beam is adopted as the condenser lens Ba, the scattered light is incident on the imaging sensor C1 from a wide direction. When a range of the incident angle of the light to the imaging sensor C1 is wide, the absorption rate with respect to the light in the imaging sensor C1 decreases according to properties of the antireflection film Ca (FIG. 15), which is disadvantageous from the viewpoint of inspection sensitivity. Further, when the imaging magnification M is 1 or more, the optical image OI is enlarged, so that a region on the sample surface corresponding to each pixel of the imaging sensor C1 decreases. As a result, noise due to the haze is reduced, and the inspection sensitivity is improved. Accordingly, the imaging magnification M is set to 1 time or more, and the angle β is smaller than the angle α. Typically, when the imaging magnification M is set to about 1.3 times, the angle β is smaller than the angle α by 5 degrees or more. When the angle β is smaller than the angle α, an enlargement ratio of the optical image OI is further improved, so that an effect that the inspection sensitivity is also further improved is achieved.

Here, FIG. 15 illustrates a cross-sectional view of the imaging sensor C1. The imaging sensor C1 is configured by stacking the antireflection film Ca, photodiodes Cb, and wiring lines Cc in order from an incident side of the scattered light. The photodiode Cb is provided for each pixel, and photoelectric conversion by the photodiode Cb is performed for each pixel. The wiring line Cc independently transmits an electric signal output from each pixel for each pixel.

Incident light LA to LC shown as examples represent trajectories of the light incident on the imaging sensor C1 from different directions in the same light beam. The incident light LA is light incident along a trajectory that coincides with the optical axis OA2 illustrated in FIGS. 7 and 8. Each of the incident light LB and LC is light incident and inclined at an angle with respect to the optical axis OA2. The same light beam includes light incident on the light receiving surface at various angles such as the incident light LA to LC, and the antireflection film Ca needs to suppress surface reflection of the light. The antireflection film Ca is, for example, a thin film of hafnium oxide ($HfO_2$). In order to suppress a decrease in an amount of light received by the imaging sensor C1, it is necessary to consider to cause the absorption rate of the antireflection film Ca with respect to the incident light LA to LC or the like to show a high value.

Here, FIG. 16 is a graph illustrating an example of the properties of the antireflection film Ca. A horizontal axis of the graph indicates the incident angle of light with respect to the imaging sensor C1, and a vertical axis of the graph indicates the absorption rate of the antireflection film Ca with respect to the light. A curve drawn with a solid line represents a property of the absorption rate with respect to the s-polarized light. A curve represented by a broken line represents a property of the absorption rate with respect to the p-polarized light.

As shown in the graph, the absorption rate with respect to the p-polarized light decreases as the incident angle increases, and a value of the absorption rate is about 50% when the incident angle is about 60 degrees. The absorption rate with respect to the s-polarized light increases as the incident angle increases when the incident angle is in a range of about 0 degree to 70 degrees, and the absorption rate of 70% or more is secured when the incident angle is in a range of about 0 degree to 80 degrees.

Accordingly, a rotation angle of the ½ wavelength plate Bd (FIG. 7) of each of the detection optical systems B1 . . . is controlled such that the s-polarized light is incident on the imaging sensor C1. At this time, by increasing the magnification of the expander constituted by the cylindrical lenses Be, Bf (FIG. 7), it is possible to bring the s-polarized light close to the linearly polarized light. Considering that the light receiving surface of the imaging sensor C1 is inclined with respect to the optical axis OA2 of each of the detection optical systems B1 . . . , it is desirable that the normal line of the light receiving surface of the imaging sensor C1 is inclined in a range of, for example, 10 degrees or more and 80 degrees or less with respect to the optical axis OA2 of each of the detection optical systems B1 . . . . As a result, the performance of the antireflection film Ca can be effectively exhibited, and a decrease in the amount of received light can be suppressed.

As illustrated in FIG. 15, the sensor having a structure in which the photodiode Cb is closer to the incident side of the light than the wiring line Cc is known as a back side illumination (BSI) sensor. In the present embodiment, when the scattered light is incident on the light receiving surface from a direction inclined with respect to the normal line of the light receiving surface of the imaging sensor C1, the light is not blocked by the wiring lines Cc in the BSI sensor, so that the amount of the received light at each pixel can be secured. In this respect, the BSI sensor is more advantageous than a front side illumination (FSI) sensor in which a wiring line portion is closer to an incident side of light than photodiodes, light incident obliquely is absorbed by the wiring line portion, and an amount of the incident light per pixel decreases.

—Influence on Inspection Caused by Height Variation of Sample—

It is ideal that the sample 1 illustrated in FIG. 14 has no height variation in the normal direction n during the inspection. However, in particular, in a case of a rθ stage, the sample is rotated at a high speed during the inspection, and there is a possibility that the height variation of the sample surface of about several tens of micrometers is generated at a high frequency of several tens to several hundreds Hz due to a vibration of the stage or a deviation of a rotational shaft. The height variation is generated at a frequency of the rotation of the sample at the maximum. When the height variation of the illumination spot BS is generated, the position of the optical image OI imaged on the light receiving surface of each of the imaging sensors C1 to Cn (excluding the imaging sensor C3) is shifted.

FIGS. 17 and 18 are diagrams illustrating the displacement direction of the optical image OI along the light receiving surface of the imaging sensor C1 accompanying the variation in the height of the illumination spot BS on the sample surface. Hereinafter, a phenomenon that occurs accompanying the height variation of the illumination spot BS in each of the detection optical systems B1 . . . and each of the imaging sensors C1 . . . , and a correction method for the same will be sequentially described.

First, when the illumination spot BS on the sample surface is displaced in the direction S1 (the transverse direction of the illumination spot BS), as illustrated in FIG. 17, the optical image OI shifts in a direction U1 along the light receiving surface of the imaging sensor C1. When the illumination spot BS on the sample surface is displaced in the direction S2 (the longitudinal direction of the illumination spot BS), the optical image OI shifts in a direction U2 along the light receiving surface of the imaging sensor C1. In this case, when the height of the illumination spot BS varies in the normal direction n of the sample surface, the optical image OI shifts in a direction m along the light receiving surface of the imaging sensor C1. Here, by setting the direction U2 as a reference, as illustrated in FIG. 17, an angle formed by a vector extending in the direction U2 and a vector extending in the direction m is set to a, and an angle formed by the vector extending in the direction U2 and a vector extending in the direction U1 is set to b. As illustrated in FIG. 18, when the height of the sample 1 increases and an optical image Di of a defect Df on the sample surface shifts in the direction m along the light receiving surface, a position of the optical image Di shifts in proportion to cos(a) in the longitudinal direction δ, and shifts in proportion to sin(a) in the transverse direction γ on the light receiving surface of the imaging sensor C1.

The shift of the optical image Di in the transverse direction γ can be ignored as long as the optical image Di does not depart from the light receiving surface of the imaging sensor C1. Since the imaging sensor C1 is a line sensor, for example, as long as the photodiode Cb having an opening long in the transverse direction γ of the light receiving surface of the imaging sensor C1 is used for each pixel, it is possible to suppress the optical image Di from departing from the light receiving surface in the transverse direction γ.

However, when the optical image Di shifts in the longitudinal direction δ across a boundary of the pixels, a correspondence relation between coordinates on the sample surface and a pixel at which the scattered light scattered at the coordinates is focused is lost. As a result, in the addition of the scattered light intensity performed by the signal integration circuit D3 described above, the plurality of pieces of data to be truly added are not added, and improvement in an SN ratio based on the signal addition is inhibited.

Further, the height variation of the illumination spot BS can cause the focusing position of each of the detection optical systems B1 . . . to be displaced in a direction intersecting the light receiving surface, and cause the optical image Di to be blurred and the signal output from the imaging sensor C1 to be degraded. For example, in order to increase a capture rate of the scattered light in each of the detection optical systems B1 . . . , it is desirable to use a lens having a large numerical aperture as the condenser lens Ba, but a depth of focus of each of the detection optical systems B1 . . . decreases as the numerical aperture increases if other conditions are the same. The depth of focus is represented as $\lambda/(2NA^2)$ using a numerical aperture NA and a wavelength λ. For example, when λ=266 μm and NA=0.55, the depth of focus is 0.4 μm.

Further, when assuming that an angle formed by the normal line of the sample surface and the optical axis OA2 is θ (FIG. 14), a component in the optical axis direction of each of the detection optical systems B1 . . . of the height variation Δn in the normal direction n of the sample 1 can be represented by Δn·cos θ. That is, when the sample 1 is displaced by Δn in the normal direction n of the sample surface, the sample 1 is displaced by Δn·cos θ in the optical axis direction of each of the detection optical systems B1 . . . , and the operating distance is displaced by Δn·cos θ. In this case, when assuming that an imaging magnification of each of the detection optical systems B1 . . . is M, a focusing position of the optical image OI determined by each of the detection optical systems B1 . . . is displaced from the light receiving surface of the imaging sensor C1 by $M^2 \cdot \Delta n \cdot \cos \theta$ in the optical axis direction of each of the detection optical systems B1 . . . . For example, when M=1.3, θ=65 degrees, and Δn=10 μm, a movement amount of the focusing position of each of the detection optical systems B1 . . . in the optical axis direction is 7 μm, and exceeds the depth of focus described above (out-focus). When the focusing position moves and the light receiving surface of the imaging sensor C1 deviates from the depth of focus in this way, the optical image Di of the defect Df is blurred and enlarged as illustrated in FIG. 18. As a result, the optical image Di does not fall within the pixels of the imaging sensor C1, and the signal output by the pixels is degraded.

In general, in order to suppress the influence on the inspection caused by the height variation of the sample surface, an automatic focusing mechanism may be adopted that controls the height of the sample stage according to the height variation of the sample surface, or controls the operating distance by moving the objective lens of the detection optical system in the optical axis direction. However, it is practically difficult to drive the heavy sample stage or the objective lens following the height variation of the sample surface that may occur at the same cycle as high-speed rotation of the sample 1 of several thousand RPM at the maximum.

—Outline of Correction—

Although details will be described later, in the present embodiment, the computer (in this example, the control device E1) executes the following correction procedure. In this correction procedure, first, as a first procedure, the height variation amount (Δn) of the illumination spot BS in the normal direction n of the sample surface is calculated based on the output of the height measuring unit F. Next, as a second procedure, based on the calculated height variation amount of the illumination spot BS, a deviation amount ($M^2 \cdot \Delta n \cdot \cos \theta$ to be described later) of the focusing position with respect to the light receiving surface in the optical axis direction of each of the detection optical systems B1 . . . , which is generated accompanying the height variation of the illumination spot BS, is calculated. In addition, as a third procedure, the actuator G is controlled based on the calculated deviation amount of the focusing position, and the focusing position of each of the detection optical systems B1 . . . is aligned with the light receiving surface of the imaging sensor C1. Further, as a fourth procedure, the scattered light intensities from the same coordinates on the sample surface are added among the plurality of data sets (for example, data sets having the same azimuth angle coordinates and different radial direction coordinates on the sample surface) for the optical image output from the imaging sensor C1. In this way, the scattered light intensities at the same coordinates may be added not only among the plurality of the data sets output from the same imaging sensor C1 when the illumination spot BS is scanned, but also among a plurality of data sets for the optical image output from a plurality of imaging sensors among the imaging sensors C1 . . . .

At this time, in the present embodiment, the direction in which the actuator G translates the imaging sensor C1 is set to a specific direction (a vector vs to be described later) inclined with respect to the optical axis OA2 of each of the detection optical systems B1 . . . . This specific direction is a direction in which the deviation of the optical image in the long axis direction (the longitudinal direction δ) of the light receiving surface, which is generated accompanying the height variation of the illumination spot BS, is corrected together with the deviation of the focusing position with respect to the light receiving surface. For example, when α=β=30 degrees and M=1, the specific direction is the normal direction of the light receiving surface.

Therefore, in the third procedure, when the actuator G is controlled based on the height variation amount of the illumination spot BS, and the imaging sensor C1 is translated in the specific direction to correct the deviation of the focusing position, the deviation of the optical image on the light receiving surface is also accordingly corrected.

—Details of Correction—

FIG. 19 is a diagram illustrating the correction of the focus deviation and an image deviation caused by the height variation of the illumination spot BS. In FIG. 19, for simplification, the optical elements other than the condenser lens Ba and the imaging lens Bg of each of the detection optical systems B1 . . . are not shown. FIG. 19 illustrates a cross section taken along a plane including the optical axis OA2 and the long axis of the illumination spot BS. When a height variation vector in the normal direction of the sample surface is set to vn, a vector vn', which is a component along a plane including the vectors v0, v1, and v2 of the height variation vector vn, contributes to focus shift. Among the components of the height variation vector vn, a component orthogonal to the vector vn' does not contribute to the focus shift, but causes the optical image Di to shift in the transverse direction γ of the imaging sensor C1.

The vector vn' is represented by the following Equation (6), in which a vector orthogonal to the vector v0 in the plane including the vectors v0, v1, and v2 is set to v3.

$$vn'=(vn \cdot v0)v0+(vn \cdot v3)v3 \qquad (6)$$

In FIG. 19, based on the measurement result of the height measuring unit F, the actuator G is controlled to displace the imaging sensor C1 by the focus deviation in a direction of the optical axis OA2. An operation amount of the imaging sensor C1 is calculated based on the height variation Δn of the illumination spot BS and the imaging magnification M. Since the imaging magnification M is 1 time or more and 2 times or less, the imaging sensor C1 may be driven by a distance substantially equal to the height variation Δn. A component in the optical axis direction of each of the detection optical systems B1 . . . , which is a component of a correction amount (a parallel movement amount) of the imaging sensor C1 for correcting the focus deviation, can be represented by $M^2 \cdot \Delta n \cdot \cos \theta$ by using the height variation Δn of the illumination spot BS and the imaging magnification M.

At this time, in the present embodiment, the light receiving surface of the imaging sensor C1 is inclined with respect to the optical axis OA2. Therefore, by translating the imaging sensor C1 in a direction inclined with respect to the optical axis OA2, it is possible to shift, in the longitudinal direction δ, the optical image Di on the light receiving surface of the imaging sensor C1 at the same time as the correction the focus deviation. The direction in which the imaging sensor C1 is driven at this time is determined based on the elevation angles α, θ of the optical axis OA2 with respect to the long axis of the illumination spot BS and the imaging magnification M, and is represented by the vector vs of the following Equation (7) by using the vectors v0 and v1.

$$vs=(M \cdot \cos \theta/\tan \alpha) \cdot v0 + M^2 \cdot \cos \theta \cdot v1 \qquad (7)$$

It is assumed that, for example, when α=30 degrees and M=1, an angle β formed by the optical axis OA2 and the long axis of the light receiving surface of the imaging sensor C1 is 30 degrees. In this case, by causing the imaging sensor C1 to translate in the normal direction of the light receiving surface such that the light receiving surface of the imaging sensor C1 moves on a plane shifted by only $M^2 \cdot \Delta n \cdot \cos \theta$ in the direction of the optical axis OA2, the focus deviation and the deviation of the optical image Di in the longitudinal direction δ are simultaneously corrected. When the imaging magnification M is larger than 1, a drive direction vs of the imaging sensor C1 for correcting the shift of the optical image Di deviates from the normal direction of the light receiving surface of the imaging sensor C1. However, if the height variation Δn is in a level that the displacement of the optical image Di in the longitudinal direction δ falls within one pixel, the imaging sensor C1 may be moved in the normal direction of the light receiving surface even when the imaging magnification M is larger than 1.

In addition, the position of the optical image Di is also shifted in the transverse direction γ along the light receiving surface of the imaging sensor C1 accompanying the height variation Δn of the illumination spot BS. The shift amount Δγ in the transverse direction γ is represented by the following Equation (8).

$$\Delta\gamma = \Delta n \cdot M \cdot \sin \theta \cdot \sin \varphi / \sin \alpha \qquad (8)$$

By using the fact that the optical image displaces in the transverse direction γ accompanying the height variation of the illumination spot BS, the imaging sensor C1 also serves as the height measuring unit F by using the two-dimensional sensor, but the above is an example of the height measuring unit F described above with reference to FIG. 13.

When the shift in the transverse direction γ is larger than a short side (a dimension in the transverse direction γ) of the light receiving surface of the imaging sensor C1, the optical image Di is not imaged on the imaging sensor C1. In this case, a component having a magnitude of Δγ in the transverse direction γ is added to an operation amount of the imaging sensor C1 so as to move the optical image Di by Δγ in the transverse direction γ on the light receiving surface.

—Effects—

(1) In the present embodiment, regarding each of the detection optical systems B1 . . . in which the optical axis OA2 is inclined with respect to the sample surface, the focus deviation, which is generated in a direction different from the normal direction n accompanying the height variation of the illumination spot BS in the normal direction n of the sample surface, is calculated, and the focus deviation is corrected. As described above, in the defect inspection device 100 in which the optical axis OA2 of each of the detection optical systems B1 . . . is inclined with respect to the sample surface, it is possible to suppress a decrease in resolution caused by the height variation Δn of the illumination spot BS.

(2) In particular, in the present embodiment, a shift direction of each of the imaging sensors C1 . . . is set in advance to a direction in which the focus deviation and the image deviation in the longitudinal direction δ generated accompanying the height variation of the illumination spot BS are simultaneously corrected. Therefore, it is possible to automatically correct the deviation of the optical image in the longitudinal direction δ of the light receiving surface of each of the imaging sensors C1 . . . by simply correcting the focus deviation according to the height variation of the illumination spot BS. Therefore, it is not necessary to multiply the shift amount of the optical image in the longitudinal direction δ according to the height variation of the illumination spot BS in order to correct the positional deviation of the optical image, and a calculating capacity of the computer is reduced, which contributes to speeding up of a process. In addition, the actuator G for focusing and the actuator for correcting the positional deviation of the optical image can be used as one actuator, and there is also an advantage of simplifying the configuration and reducing the number of parts.

(3) The angle formed by the optical axis OA2 of each of the detection optical systems B1 . . . and the normal line of the light receiving surface of each of the imaging sensors C1 . . . is 10 degrees or more and 80 degrees or less, and the scattered light incident on each of the imaging sensors C1 . . . can be adjusted to the s-polarized light. Accordingly, as described above, it is possible to effectively exhibit the performance of the antireflection film Ca of each of the imaging sensors C1 . . . , and it is possible to suppress a decrease in the amount of light received by the photodiodes Cb of each of the imaging sensors C1 . . . .

(4) The imaging magnification M of each of the detection optical systems B1 . . . is 1 time or more, and the inclination angle β of the light receiving surface of each of the imaging sensors C1 . . . with respect to the optical axis OA2 of each of the detection optical systems B1 . . . is smaller than the inclination angle α of the optical axis OA2 with respect to the sample surface. Accordingly, the range of the incident angle of the light on each of the imaging sensors C1 . . . is suppressed, and the decrease in the absorption rate of each of the imaging sensors C1 . . . with respect to the light, and further the decrease in the inspection sensitivity are suppressed.

(5) Since the imaging magnification M of each of the detection optical systems B1 . . . is 2 times or less, it is possible to suppress the focus deviation and the image deviation to an extent that can be corrected by the piezoelectric actuator. By adopting the piezoelectric actuator as the actuator G, a response speed can be increased, and even when the height variation of the illumination spot BS is generated at a higher frequency, the shift of the focus and the image following the height variation can be corrected.

(6) Further, as illustrated in FIG. 13, when the two-dimensional sensor is used for each of the imaging sensors C1 . . . , and the two-dimensional sensors also serve as the height measuring unit F, it is not necessary to provide the height measuring unit F separately from the imaging sensors C1 . . . . Accordingly, there is an advantage of simplifying the configuration and reducing the number of parts.

(7) Further, when each of the imaging sensors C1 . . . is driven by the actuator G, in a case where the optical image moves in the direction m along the light receiving surface, this movement has a direction component in the transverse direction γ. In other words, in the present embodiment, since the shift direction in which the actuator G moves a corresponding one of the imaging sensors C1 . . . is set to a specific direction, the displacement of the image in the transverse direction γ is also corrected by position control on the imaging sensors C1 . . . . In this case, for example, when the two-dimensional sensor is used for each of the imaging sensors C1 . . . and the shift amount Δγ of the optical image measured by the two-dimensional sensor is zero, it can be determined that the position of each of the imaging sensors C1 . . . can be accurately controlled as targeted.

Second Embodiment

FIG. 20 is a diagram illustrating the correction of the focus deviation and the image deviation caused by the height variation of the illumination spot in a defect inspection device according to a second embodiment of the invention, and corresponds to FIG. 19 of the first embodiment. Except for a difference from the first embodiment to be described with reference to FIG. 20, the present embodiment is the same as the first embodiment.

The present embodiment is different from the first embodiment in that the focus deviation is corrected by driving the each of detection optical systems B1 . . . , and the image deviation is corrected by driving each of the imaging sensors C1 . . . .

In the present embodiment, a driven target of the actuator G (for example, the piezoelectric actuator) as the focus actuator for moving the focusing position of each of the detection optical systems B1 . . . is the imaging lens Bg as a part of the optical elements of each of the detection optical systems B1 . . . . The actuator G is configured to move the imaging lens Bg in the optical axis direction of each of the detection optical systems B1 . . . . In this example, a case where the imaging lens Bg is set as the driven target is described, but another optical element such as an objective lens and a relay lens may be used as the driven target. In addition to the lens, an optical component such as a prism element that adjusts a length of the optical path in the optical axis direction may be used as the driven target. In addition to the actuator G, an actuator G' (for example, the piezoelectric actuator) is provided for each of the imaging sensors C1 . . . as a sensor shift actuator that translates a corresponding one of the imaging sensors C1 . . . in the surface direction (a direction of the vector v1) of the light receiving surface.

Then, based on the height variation amount of the illumination spot BS, the computer (the signal processing device D or the control device E1) controls the actuator G to translate the imaging lens Bg in the optical axis direction of the corresponding detection optical system. Accordingly, the focusing position of the corresponding one of the detection optical systems B1 . . . moves onto the light receiving surface of the corresponding one of the imaging sensors C1 . . . , and the deviation of the focusing position of the corresponding one of the detection optical systems B1 . . . with respect to the light receiving surface of the corresponding one of the imaging sensors C1 . . . is corrected.

In addition, based on the height variation amount of the illumination spot BS, the computer (the signal processing device D or the control device E1) calculates the deviation amount of the optical image in the long axis direction (the direction of the vector v1) of the light receiving surface of each of the imaging sensors C1 . . . , which is generated accompanying the height variation of the illumination spot BS. Then, the computer controls each of actuators G' based on the deviation amount of the optical image to translate each of the imaging sensors C1 . . . so as to correct the deviation of the optical image on the light receiving surface.

Specifically, when the sample 1 varies by an in the normal direction n of the sample surface, the focus deviation of the optical image can be corrected by moving the respective imaging lenses Bg of the detection optical systems B1 . . . by the shift amount, which is obtained by the following Equation (9), in the direction of the optical axis OA2.

$$\Delta lens = \Delta n \cdot M^2 \cdot \cos \theta + \Delta n \cdot M \cdot \cos \theta / (\tan \alpha \cdot \tan \beta) \qquad (9)$$

At this time, the optical image is shifted in the longitudinal direction δ along the light receiving surface of each of the imaging sensors C1 . . . . A shift amount Δδ of the optical image is represented by the following equation.

$$\Delta\delta = \Delta n \cdot M \cdot \cos \theta / (\tan \alpha \cdot \sin \beta) \qquad (10)$$

The image deviation with respect to the light receiving surface caused by image shift can be corrected by driving the actuator G' and moving the imaging sensor C1 by $\Delta\delta = \Delta n \cdot M \cdot \cos \theta / (\tan \alpha \cdot \sin \beta)$ in the longitudinal direction δ (the direction of the vector v1).

In the case of the present embodiment, in addition to the effects according to the first embodiment, when there is a possibility that the correction accuracy may be affected by a deviation of a drive shaft or an operation delay of the actuator, the possibility can be dispersed into two drive systems by individually calculating and correcting the focus deviation and the image deviation.

Third Embodiment

FIG. 21 is a diagram illustrating the correction of the focus deviation and the image deviation caused by the height variation of the illumination spot in a defect inspection device according to a third embodiment of the invention. Except for a difference from the first embodiment to be described with reference to FIG. 21, the present embodiment is the same as the first embodiment.

The present embodiment is different from the first embodiment in that the focus deviation is corrected by driving each of the detection optical systems B1 . . . , and the image deviation is corrected by data processing.

In the present embodiment, a part of the optical elements (for example, the imaging lens Bg) in each of the detection optical systems B1 . . . is driven by the actuator G according to the height variation of the illumination spot BS, and the focus deviation of each of the detection optical systems B1 . . . is corrected in the same manner as in the second embodiment.

On the other hand, regarding the correction of the image deviation, first, the computer (the signal processing device D or the control device E1) calculates the deviation amount of the optical image in the long axis direction of the light receiving surface of each of the imaging sensors C1 . . . , which is generated accompanying the height variation of the illumination spot BS, in the same manner as in the second embodiment. Then, based on the calculated deviation amount of the optical image, a corresponding deviation of each of the pixels among the plurality of data sets (for example, the data sets having the same azimuth angle coordinates and different radial direction coordinates on the sample surface) is corrected for the optical image. Accordingly, the scattered light intensities at the same coordinates on the sample surface are added.

Specifically, when the height variation Δn is generated in the illumination spot BS on the sample surface, the optical image Di of the defect Df is shifted by $\Delta n \cdot M \cdot \cos \theta / (\tan \alpha \cdot \sin \beta)$ in the longitudinal direction δ on the light receiving surface of each of the imaging sensors C1 . . . as described above. For example, when addition processing of the scattered light intensities among the plurality of data sets of the sample 1 is performed by the signal integration circuit D3 described above, the scattered light intensities from the same coordinates on the sample can be added by changing the combination of the pixels to be added based on the shift amount.

In the case of the present embodiment, in addition to the effects of the first embodiment, it is possible to suppress an influence on the correction accuracy of the image deviation caused by the deviation of the drive shaft or the operation delay of the actuator.

Fourth Embodiment

FIG. 22 is a diagram illustrating the correction of the focus deviation and the image deviation caused by the height variation of the illumination spot in a defect inspection device according to a fourth embodiment of the invention, and corresponds to FIG. 19 of the first embodiment. Except for a difference from the first embodiment to be described with reference to FIG. 22, the present embodiment is the same as the first embodiment.

The present embodiment is different from the first embodiment in that, in each of the detection optical systems B1 . . . , a mirror Bp and a second lens group Bq, Br are disposed between the imaging lens Bg and a corresponding one of the imaging sensors C1 . . . . In the present embodiment, an intermediate image of the illumination spot BS is reflected by the mirror Bp, and the optical image of the illumination spot BS is formed on the light receiving surface of each of the imaging sensors C1 . . . through the second lens group Bq, Br. The mirror Bp is driven by the actuator G (for example, the piezoelectric actuator) in response to a command from the computer, and the actuator G drives the mirror Bp to correct the focus deviation. FIG. 22 illustrates a configuration in which an incident angle of the scattered light with respect to the mirror Bp is 45 degrees, but the incident angle can be changed.

Specifically, with respect to the height variation Δn of the illumination spot BS, the mirror Bp is moved by the actuator G by Δmirror, which is obtained by the following Equation (11), in the normal direction of the mirror Bp so as to correct the focus deviation.

$$\Delta mirror = \{\Delta n \cdot M^2 \cdot \cos \theta + (\Delta n \cdot M \cdot \cos \theta)/(\tan \alpha \cdot \sin \beta)\}/\sqrt{2} \qquad (11)$$

The shift amount of the optical image Di of the defect Df generated accompanying the height variation of the illumination spot BS on the light receiving surface of each of the imaging sensors C1 . . . is $\Delta n \cdot M \cdot \sin\theta \cdot \sin\varphi / \sin\alpha$. Therefore, it is possible to move each of the imaging sensors C1 . . . in the direction of the vector v1 by $\Delta n \cdot M \cdot \sin\theta \cdot \sin\varphi / \sin\alpha$ by the actuator G' so as to correct the image deviation on the light receiving surface. The image deviation can also be corrected by shifting the combination of the pixels added by the signal integration circuit D3 by $\Delta n \cdot M \cdot \sin\theta \cdot \sin\varphi / \sin\alpha$ in the same manner as in the third embodiment, instead of sensor shift.

In the present embodiment, the same effects as those of the second embodiment or the third embodiment can also be achieved. In addition, a response speed of focus correction can be increased by reducing a weight of the mirror Bp.

Fifth Embodiment

FIG. 23 is a diagram illustrating the correction of the focus deviation and the image deviation caused by the height variation of the illumination spot in a defect inspection device according to a fifth embodiment of the invention.

The present embodiment is an example in which the control on the Z stage of the stage ST corresponding to the height variation of the illumination spot BS is added. The stage ST is driven in a Z axis direction (the normal direction n) by the computer (for example, the control device E1) in response to the output of the height measuring unit F such that the height variation $\Delta n$ of the illumination spot BS on the sample surface measured by the height measuring unit F decreases. The focus deviation and the image deviation are corrected by the control on the actuators G and G' in the same manner as in the second embodiment.

As in this example, when a plurality of types of actuators including an actuator for suppressing the height variation of the sample surface, and an actuator for correcting the focus deviation or the image deviation are provided, target operation amounts assigned to the respective actuators are different. In the present embodiment, the computer calculates a respondable operation amount of one actuator having a lowest response speed, and calculates target operation amounts of other actuators by subtracting the respondable operation amount of the one actuator. In the example of FIG. 23, when the height variation of the illumination spot BS is completely corrected by stage control having a lowest response speed, the control on the actuators G and G' is not necessary. However, when the height variation of the illumination spot BS is not completely corrected by the stage control, the control on the actuators G and G' is necessary. In this case, since the height variation of the sample surface is changed by the stage control, a control amount of each of the actuators G and G' is calculated by setting a remaining amount of the height variation accompanying the stage control as a value of the height variation of the sample surface.

For example, as illustrated in FIG. 23, in the present embodiment, a correction amount calculating circuit E4 (for example, a program) is provided in the computer (in this example, the control device E1). In the correction amount calculating circuit E4, the respective operation amounts of the stage ST, the imaging lens Bg (a part of the optical elements of each of the detection optical systems B1 . . . ), and each of the imaging sensors C1 . . . are calculated based on the output of the height measuring unit F. The operation amount of the stage ST is converted into an analog command signal by a stage-position control unit E5, and output to the stage ST. The operation amount of the imaging lens Bg is converted into an analog command signal by an optical unit-position control unit E6, and output to the actuator G.

The operation amount of each of the imaging sensors C1 . . . is converted into an analog command signal by a sensor-position control unit E7, and output to the actuator G'. Accordingly, the stage ST, the imaging lens Bg of each of the detection optical systems B1 . . . , and each of the imaging sensors C1 . . . are shifted by respectively assigned distances. As a result, the height variation $\Delta n$ of the illumination spot BS is suppressed by the stage control, and the focus deviation and the image deviation accompanying the an that is not completely corrected are corrected by the movements of the imaging lens and the sensor.

As a specific example, when the stage ST is moved by $\Delta$stage in the normal direction n of the stage, an operation amount $\Delta$lens of the imaging lens Bg in the optical axis OA2 direction is represented by the following equation.

$$\Delta\text{lens} = (\Delta n - \Delta\text{stage}) \cdot M \cdot \cos\theta\{M + 1/(\tan\alpha \cdot \tan\beta)\} \qquad (12)$$

In a case of setting a drive amount $\Delta$stage of the stage ST, for example, an amplitude $A$stage of the stage ST that can operate at a frequency fn of the height variation of the sample surface is calculated, and a target operation amount $\Delta$stage per cycle of the height variation of the sample 1 is set as $\Delta\text{stage} = A\text{stage} \cdot \sin(2\pi \cdot \text{fn} + \varphi\text{stage})$.

The focus deviation can be corrected by moving the imaging lens Bg by $\Delta$lens as in the second embodiment. Further, the focus deviation can also be corrected by driving each of the imaging sensors C1 . . . as in the first embodiment or by moving the mirror Bp as in the fourth embodiment.

In this example, the shift amount $\Delta\delta$ of the optical image generated in the longitudinal direction $\delta$ on the surface of the imaging sensor C1 is represented by the following equation.

$$\Delta\delta = (\Delta n - \Delta\text{stage}) \cdot M \cdot \cos\theta / (\tan\alpha \cdot \tan\beta) \qquad (13)$$

The image deviation can be corrected by moving each of the imaging sensors C1 . . . by $\Delta\delta$ as in the second embodiment. The image deviation can also be corrected by shifting the combination of the pixels added by the signal integration circuit D3 by $\Delta\delta$ as in the third embodiment.

According to the present embodiment, it is possible to correct the height variation of the illumination spot BS with a slow cycle by the stage control, and to suppress the occurrence of the focus deviation and the image deviation generated accompanying the height variation of the illumination spot BS. In addition, when the height variation of the illumination spot BS is not completely corrected by the stage control with a short cycle, the focus deviation and the image deviation generated accompanying the height variation of the illumination spot BS that is not completely corrected are corrected by the cooperation of any one of the correction methods described in the first to fourth embodiments and the stage control. In this case, when the height variation of the illumination spot BS decreases due to the stage control, the operation amount of the actuator for correcting the focus deviation and the image deviation is reduced, and the improvement in the response speed and the control accuracy is also expected.

Sixth Embodiment

FIG. 24 is a diagram illustrating the correction of the focus deviation and the image deviation caused by the height variation of the illumination spot in a defect inspection device according to a sixth embodiment of the invention. Except for a point to be described with reference to FIG. 24, the present embodiment is the same as any one of the embodiments that have already been described.

The present embodiment is an example in which a time delay generated when the actuator G or G' (for example, the piezoelectric actuator) drives the driven target is compensated. Here, compensation for a time delay in the driving of the imaging lens Bg by the actuator G in each of the detection optical systems B1 . . . as in the second embodiment is described, but a time delay for an operation of the driven target other than the imaging lens Bg can be compensated in the same manner. Specifically, the above can also be applied to, for example, an operation of the condenser lens Ba, each of the imaging sensors C1 . . . , or the mirror Bp.

The defect inspection device according to the present embodiment includes a position sensor H that detects a position of the imaging lens Bg (an example of the driven target) driven by the actuator G as illustrated in FIG. 24. The computer (for example, the control device E1) performs closed-loop control on the actuator G based on an output of the position sensor H. That is, the output of the position sensor H is fed back to the computer, and the computer calculates, based on the output of the position sensor H, a positional deviation of the imaging lens Bg with respect to a target position instructed by the computer, adds a correction value for reducing the positional deviation, and outputs a command to the actuator G.

Specifically, a response time for the operation of the driven target is determined by a mass of the driven target. When the lens is set as the driven target, since a mass of the lens is generally larger than that of the imaging sensor, the response time increases, and a time delay in the operation may occur. In addition to the response time for the operation of the driven target with respect to an input of a control signal to the actuator, a time from when the output of the height measuring unit F is transmitted to the computer to when the control signal is output from the computer to the actuator also contributes to the time delay. When the lens having a larger mass is set as the driven target, a time delay of about several milliseconds may occur.

When the time delay occurs, an operation amount $\Delta$lens_delay (t) of the imaging lens Bg expected for the command can be represented by the following Equation (14) by using the frequency fn of the height variation of the illumination spot BS, a phase delay p, and an amplitude A.

$$\Delta lens\_delay(t)=A \cdot \sin(2\pi fn \cdot t+p) \quad (14)$$

A focus error $\Delta$'lens is $\Delta$'lens=$\Delta$lens(t)–$\Delta$lens_delay(t). $\Delta$lens(t) is an operation amount corresponding to a command without a delay, and is represented by $\Delta$lens(t)=A·sin (2$\pi$·fn·t). For example, when the frequency fn=100 Hz, the amplitude A for lens driving=20 μm, and the phase delay φ=1 ms, the focus error of 10 μm at the maximum occurs.

An amount corresponding to this focus error $\Delta$'lens is calculated by the computer based on the output of the position sensor H, and the time delay can be compensated by performing the closed-loop control on the actuator G as illustrated in FIG. 24.

When the focus error $\Delta$'lens cannot be completely corrected, the image deviation in the longitudinal direction $\delta$ along the light receiving surface of each of the imaging sensors C1 . . . occurs. The shift amount $\Delta\delta$ is represented by the following Equation (15).

$$\Delta\delta=\Delta n \cdot M \cdot \cos \theta/(\tan \alpha \cdot \sin \beta)-\Delta' lens \cdot \sin \beta \quad (15)$$

The shift amount $\Delta\delta$ can be corrected by shifting the combination of signals added by the signal integration circuit D3 by $\Delta\delta$ as in the third embodiment, for example. Further, each of the imaging sensors C1 . . . can be driven by the actuator G' to correct 65 as in the second embodiment, in this case, the closed-loop control for the position of the imaging lens Bg described above can be applied to the compensation of the time delay in the operation of each of the imaging sensors C1 . . . .

When the height variation of the illumination spot BS that occurs in the rotation cycle of the sample 1 is dominant, the operation amount of the imaging lens Bg can be calculated by using a predicted value of the height variation of the illumination spot BS. When assuming that coordinates on the sample surface defined by the direction S1 (the circumferential direction of the sample 1) and the direction S2 (a diameter direction of the sample 1) are (s1, s2), and a scanning distance in the direction S1 during one rotation of the sample 1 is d, the height variation occurring after one rotation of the sample 1 can be predicted by the following equation.

$$\Delta n(s1,s2+d)=\Delta n(s1,s2) \quad (16)$$

Therefore, a target lens operation amount $\Delta$lens(s1, s2+d) after one rotation can be represented by the following equation.

$$\Delta lens(s1,s2+d)=\Delta n(s1,s2) \cdot M \cdot \cos \theta\{M+1/(\tan \alpha \cdot \tan \beta)\} \quad (17)$$

When the height variation of the illumination spot BS is predicted by using Equation (17) based on a measured value of the height variation of the sample surface, the actuator G can be controlled based on the predicted value. Further, the closed-loop control based on the output of the position sensor H can also be applied to this control.

When there is an error $\Delta$=$\Delta$n(s1, s2+d)–$\Delta$n(s1, s2) between the predicted value and the measured value of the height variation of the sample 1, the image deviation in the longitudinal direction $\delta$ along the light receiving surface occurs due to the error $\Delta$. This shift amount $\Delta\delta$ can be represented by the following Equation (18).

$$\Delta\delta=\Delta n(s1,s2+d)M \cdot \cos \theta/(\tan \alpha \cdot \sin \beta)-\Delta M \cdot \cos \theta(M+1/(\tan \alpha \cdot \tan \beta))(1-\cos \beta) \quad (18)$$

The image deviation of $\Delta\delta$ can be corrected in the same manner as in any one of the embodiments that have already been described.

In addition, FIG. 24 illustrates a configuration in which the stage ST is driven in a height direction in order to correct the height variation of the sample surface. However, as described in the fifth embodiment, since the mass of the stage ST is large, the stage control may not completely follow the height variation of the sample 1 generated at the frequency fn of several tens to several hundreds Hz at the maximum. In this case, the amplitude Astage of the stage ST that can operate at the frequency fn is calculated, and the target operation amount $\Delta$stage per cycle of the height variation of the sample 1 is set to $\Delta$stage=Astage·sin (2$\pi$·fn+φstage). By the stage control, the height variation of the illumination spot BS is suppressed. The focus deviation caused by the height variation of the illumination spot BS that is not completely corrected in the stage ST is corrected by the position control on the imaging lens Bg of each of the detection optical systems B1 . . . .

Alternatively, when the height variation of the sample surface includes a component having a frequency lower than the rotation cycle of the sample 1, and the stage control can follow the low-frequency component, the height of the stage ST is controlled by a frequency fstage of the low-frequency component, and the low-frequency component of the height variation of the sample surface is canceled out. In this case, a target operation amount of the stage ST in the height direction can be represented as Δstage=Astage·sin (2π·fstage+φstage). When there is reproducibility in the low-frequency component, the low-frequency component may be extracted to determine the amplitude Astage or the frequency fstage by analyzing a measurement result of the height measuring unit F during pre-measurement of the height variation of the sample 1 (or during the inspection of the sample 1).

Regarding a high-frequency component of the height variation of the sample surface, the focus deviation and the image deviation caused by the high-frequency component are corrected by the control on the actuators G, G'. In this case, a target operation amount of the driven target can be calculated by replacing the height variation Δn of the illumination spot BS with Δn−Δstage.

Further, when there is reproducibility in the height variation of the sample 1, a standard sample in which a position of a defect is known is inspected by the defect inspection device 100, and an error of correction control on the stage ST or the actuators G, G' can be calculated by comparing the inspection result of the standard sample with the known position of the defect. When there is reproducibility in the height variation of the sample 1, the inspection accuracy can be further improved by reflecting the error data in the control on the stage ST or the actuators G, G'.

(Modification)

As described in the fifth embodiment, the correction of the height variation of the sample surface by height control on the stage ST can be combined with the correction of the focus deviation and the image deviation by the actuator G or the actuators G, G'. Some examples of this point will be described.

First, a specific example of a case of combining the correction of the height variation of the sample surface by the height control on the stage ST with the first embodiment will be described.

When the stage ST is moved by Δstage in the normal direction n of the sample surface with respect to the height variation Δn of the sample surface, an operation amount in the normal direction of the light receiving surface of each of the imaging sensors C1 . . . is obtained by the following Equation (19).

$$\Delta sensor=(\Delta n-\Delta stage)M\cdot\cos\theta(\cos\beta/\tan\alpha+M\sin\beta) \quad (19)$$

In a case where the imaging magnification M is close to 1, when each of the imaging sensors C1 . . . is driven in the normal direction of the light receiving surface by the operation amount obtained by Equation (19), the focus deviation and the image deviation can be corrected at the same time as described in the first embodiment.

Next, a specific example of a case of combining the correction of the height variation of the sample surface by the height control on the stage ST and the correction of the focus deviation by the position control on the imaging lens Bg with the first embodiment will be described. In this example, while the height variation of the sample surface with a slow cycle is corrected by the height control on the stage ST, the focus deviation generated accompanying the height variation of the sample surface in a fast cycle is corrected by the position control on the imaging lens Bg. Then, the focus deviation that is not completely corrected by the position control on the imaging lens Bg is corrected by the position control on the imaging sensor C1 together with the image deviation generated accompanying the height variation of the sample surface in the fast cycle.

Specifically, when the stage ST is moved by Δstage in the normal direction n of the sample surface and the imaging lens Bg of each of the detection optical systems B1 . . . is moved by Δlens in the optical axis direction, each of the imaging sensors C1 . . . is shifted by the operation amount Δsensor represented by the following Equation (20) in the normal direction of the light receiving surface. Accordingly, the focus deviation that is not completely corrected by the position control on the imaging lens Bg is corrected.

$$\Delta sensor=(\Delta n-\Delta stage)M\cdot\cos\theta(\cos\beta/\tan\alpha+M\cdot\sin\beta)-\Delta lens\cdot\sin\beta \quad (20)$$

Further, the shift amount Δδ of the optical image in the longitudinal direction δ along the light receiving surface of each of the imaging sensors C1 . . . is represented by the following Equation (21).

$$\Delta\delta=(\Delta n-\Delta stage)M\cdot\cos\theta(\sin\beta/\tan\alpha-M\cdot\cos\beta)+\Delta lens\cdot\cos\beta \quad (21)$$

When each of the imaging sensors C1 . . . is moved in the normal direction of the light receiving surface, each of the imaging sensors C1 . . . is also moved in the longitudinal direction δ as in the first embodiment, and thus the shift amount Δδ can be corrected. In addition, instead of moving each of the imaging sensors C1 . . . in the longitudinal direction δ, the image deviation of Δδ can also be corrected by shifting the combination of the pixels for which the scattered light intensity is added by the signal integration circuit D3 as in the third embodiment.

In addition, the embodiments of the invention are not limited to the examples described above, and can be appropriately modified. All of the elements included in the examples described above are not necessarily essential, and a part of the constituent elements (excluding essential elements) may be omitted appropriately. In addition, a part of constituent elements according to one embodiment can be appropriately replaced with constituent elements according to another embodiment, and the constituent elements according to another embodiment can be added to one embodiment.

REFERENCE SIGNS LIST

1: sample
100: defect inspection device
A: illumination optical system
B1 to Bn: detection optical system
Bg: imaging lens (a part of optical elements)
BS: illumination spot C1 to Cn: imaging sensor
D: signal processing device (computer)
E1: control device (computer)
F: height measuring unit
G, G': actuator (focus actuator, sensor shift actuator)
H: position sensor
M: imaging magnification
n: normal direction of surface of sample
OA2: optical axis of detection optical system
OI: optical image of illumination spot
ST1: sample stage
vs: specific direction
α: inclination angle of optical axis of detection optical system with respect to surface of sample
β: inclination angle of light receiving surface of imaging sensor with respect to optical axis of detection optical system
βn: height variation amount

The invention claimed is:

1. A defect inspection device, comprising:
a sample stage configured to support a sample;
an illumination optical system configured to form, on a surface of the sample, an illumination spot having a long axis;
a detection optical system configured to condense scattered light of the illumination spot from the surface of the sample;
an imaging sensor including a plurality of pixels and configured to output a data set of a scattered light intensity of an optical image of the illumination spot, the optical image of the illumination spot being imaged on a light receiving surface through the detection optical system;
a height measuring unit configured to measure a height of the sample;
a focus actuator configured to relatively move a focusing position of the optical image, which is determined by the detection optical system, with respect to the light receiving surface of the imaging sensor;
a position sensor configured to detect a position of a driven target of the focus actuator; and
a computer configured to control the focus actuator according to an output of the height measuring unit, wherein
an optical axis of the detection optical system is inclined with respect to the surface of the sample,
the imaging sensor is inclined with respect to the optical axis of the detection optical system such that a long axis of the light receiving surface coincides with a position conjugate with the illumination spot, and
the computer is configured to:
calculate, based on the output of the height measuring unit, a height variation amount of the illumination spot in a normal direction of the surface of the sample,
calculate, based on the height variation amount of the illumination spot, a deviation amount of the focusing position with respect to the light receiving surface in an optical axis direction of the detection optical system, the deviation amount of the focusing position being generated accompanying a height variation of the illumination spot,
calculate, based on an output of the position sensor, a positional deviation of the driven target with respect to a target position,
control, based on the deviation amount of the focusing position, the focus actuator to align the focusing position with the light receiving surface of the imaging sensor,
calculate a deviation amount of the optical image for a plurality of the imaging sensors, the deviation amount of the optical image being generated accompanying the height variation of the illumination spot, and
correct, based on the deviation amount of the optical image, a corresponding deviation of each of the pixels, and add scattered light intensities at the same coordinates of the sample among a plurality of the data sets for the optical images output from the imaging sensors.

2. The defect inspection device according to claim 1, wherein
the scattered light incident on the imaging sensor is s-polarized light, and
an angle formed by the optical axis of the detection optical system and a normal line of the light receiving surface is 10 degrees or more and 80 degrees or less.

3. The defect inspection device according to claim 1, wherein
an imaging magnification of the detection optical system is 1 time or more, and
an inclination angle of the light receiving surface of the imaging sensor with respect to the optical axis of the detection optical system is smaller than an inclination angle of the optical axis of the detection optical system with respect to the surface of the sample.

4. The defect inspection device according to claim 1, wherein
the focus actuator is a piezoelectric actuator, and an imaging magnification of the detection optical system is 2 times or less.

5. The defect inspection device according to claim 1, wherein
the imaging sensor also serves as the height measuring unit, and
the computer is configured to calculate the height variation amount of the illumination spot based on a position of the optical image in a transverse direction of the light receiving surface.

6. The defect inspection device according to claim 1, wherein
the focus actuator is configured to move the imaging sensor,
a direction in which the focus actuator translates the imaging sensor is set to a specific direction inclined with respect to the optical axis of the detection optical system such that a deviation of the optical image in a long axis direction of the light receiving surface, which is generated accompanying the height variation of the illumination spot, is corrected together with a deviation of the focusing position, and
the computer is configured to correct the deviation of the focusing position together with the deviation of the optical image by controlling the focus actuator based on the height variation amount of the illumination spot to translate the imaging sensor in the specific direction.

7. The defect inspection device according to claim 1, wherein
the focus actuator is configured to move a part of optical elements of the detection optical system in the optical axis direction of the detection optical system, and
the computer is configured to correct a deviation of the focusing position by controlling the focus actuator based on the height variation amount of the illumination spot to translate the optical element.

8. The defect inspection device according to claim 7, further comprising:
a sensor shift actuator configured to translate the imaging sensor in a surface direction of the light receiving surface, wherein
the computer is configured to:
correct a deviation of the optical image by controlling the sensor shift actuator based on the deviation amount of the optical image to translate the imaging sensor.

9. The defect inspection device according to claim 1, wherein:
the computer is configured to control, in the control on the focus actuator, the focus actuator to reduce the positional deviation of the driven target.

10. The defect inspection device according to claim 1, wherein
as the focus actuator or a sensor shift actuator configured to translate the imaging sensor in a surface direction of the light receiving surface, a plurality of actuators among an actuator for driving the imaging sensor, an actuator for driving a part of optical elements of the detection optical system, and an actuator for driving the sample stage are provided, and
the computer is configured to calculate a respondable operation amount of one actuator having a lowest response speed, and calculate target operation amounts of other actuators by subtracting the respondable operation amount of the one actuator.

11. The defect inspection device according to claim 6, wherein
when the specific direction is set to vs, an elevation angle of the optical axis of the detection optical system with respect to the long axis of the illumination spot is set to α, an angle formed by a normal line of the surface of the sample and the optical axis of the detection optical system is set to θ, an imaging magnification of the detection optical system is set to M, a vector of the optical axis of the detection optical system is set to v0, and a vector of the long axis of the light receiving surface is set to v1, the specific direction vs is represented by:

$v0 = (\sin\theta \cdot \sin\varphi, \sin\theta \cdot \cos\varphi \cdot \cos\theta)$.

* * * * *